United States Patent
Guedon

(10) Patent No.: US 12,476,528 B2
(45) Date of Patent: Nov. 18, 2025

(54) VERTICAL METAL SENSING METHOD FOR DC-DC CONVERTER

(71) Applicant: STMicroelectronics Asia Pacific Pte Ltd, Singapore (SG)

(72) Inventor: Yannick Guedon, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 341 days.

(21) Appl. No.: 18/106,629

(22) Filed: Feb. 7, 2023

(65) Prior Publication Data

US 2023/0275502 A1    Aug. 31, 2023

Related U.S. Application Data

(63) Continuation-in-part of application No. 17/680,666, filed on Feb. 25, 2022, now Pat. No. 12,119,735.

(51) Int. Cl.
  *H02M 1/00* (2007.01)
  *G01R 19/00* (2006.01)
  *H02M 3/00* (2006.01)

(52) U.S. Cl.
  CPC ...... *H02M 1/0009* (2021.05); *G01R 19/0092* (2013.01); *H02M 3/003* (2021.05)

(58) Field of Classification Search
  CPC .. H02M 1/0009; H02M 3/003; G01R 19/0092
  See application file for complete search history.

(56) References Cited

U.S. PATENT DOCUMENTS

| | | | |
|---|---|---|---|
| 6,861,824 B1 | 3/2005 | Liu et al. | |
| 7,960,997 B2 | 6/2011 | Williams | |
| 9,671,437 B2 | 6/2017 | Akahane | |
| 9,673,192 B1 | 6/2017 | Lopata et al. | |
| 10,601,330 B1* | 3/2020 | Cappabianca | H02M 3/158 |
| 10,734,249 B2 | 8/2020 | Tan | |

(Continued)

FOREIGN PATENT DOCUMENTS

| | | |
|---|---|---|
| EP | 2966460 B1 | 3/2021 |
| JP | 3707355 B2 | 8/2005 |
| WO | 2021165952 A1 | 8/2021 |

OTHER PUBLICATIONS

"ProSLIC(r) Programmable CMOS SLIC/Codec with Ringing/Battery Voltage Generation," Silicon Labs, Si3210/Si3211, 2012, 149 pages.

(Continued)

*Primary Examiner* — Alex Torres-Rivera
(74) *Attorney, Agent, or Firm* — Crowe & Dunlevy LLC

(57) ABSTRACT

In a DC-DC converter, a layout is designed to enable utilization the conductive trace connecting the converter output node to an output bump at which the load is attached as a sense resistor. The layout forces the output current down into lower metallization levels of an interconnect layer reaching the converter output node before the output current flows up into this conductive trace and out through the output bump. The conductive trace includes resistive pillars connected in parallel or series between the lower metallization levels and a top metallization layer of the conductive trace, with these resistive pillars being substantially greater in resistance than the lower metallization levels and the top metallization layer of the conductive trace.

9 Claims, 19 Drawing Sheets

(56) References Cited

U.S. PATENT DOCUMENTS

| | | |
|---|---|---|
| 10,958,167 B2 | 3/2021 | Price et al. |
| 2010/0085025 A1 | 4/2010 | Kato |
| 2011/0089931 A1 | 4/2011 | Podlisk et al. |
| 2015/0187414 A1 | 7/2015 | Perner |
| 2017/0331371 A1 | 11/2017 | Parto |
| 2019/0148795 A1 | 5/2019 | Hawley et al. |
| 2020/0378244 A1 | 12/2020 | Cooley et al. |
| 2021/0167606 A1 | 6/2021 | Carre et al. |
| 2022/0244296 A1* | 8/2022 | Yamaura ............... H02M 7/003 |
| 2023/0003769 A1* | 1/2023 | Ichijyo ................. H02M 7/003 |

OTHER PUBLICATIONS

EPO Search Report and Written Opinion for counterpart EP Appl. No. 23157895.6, report dated Jul. 14, 2023, 11 pgs.

* cited by examiner

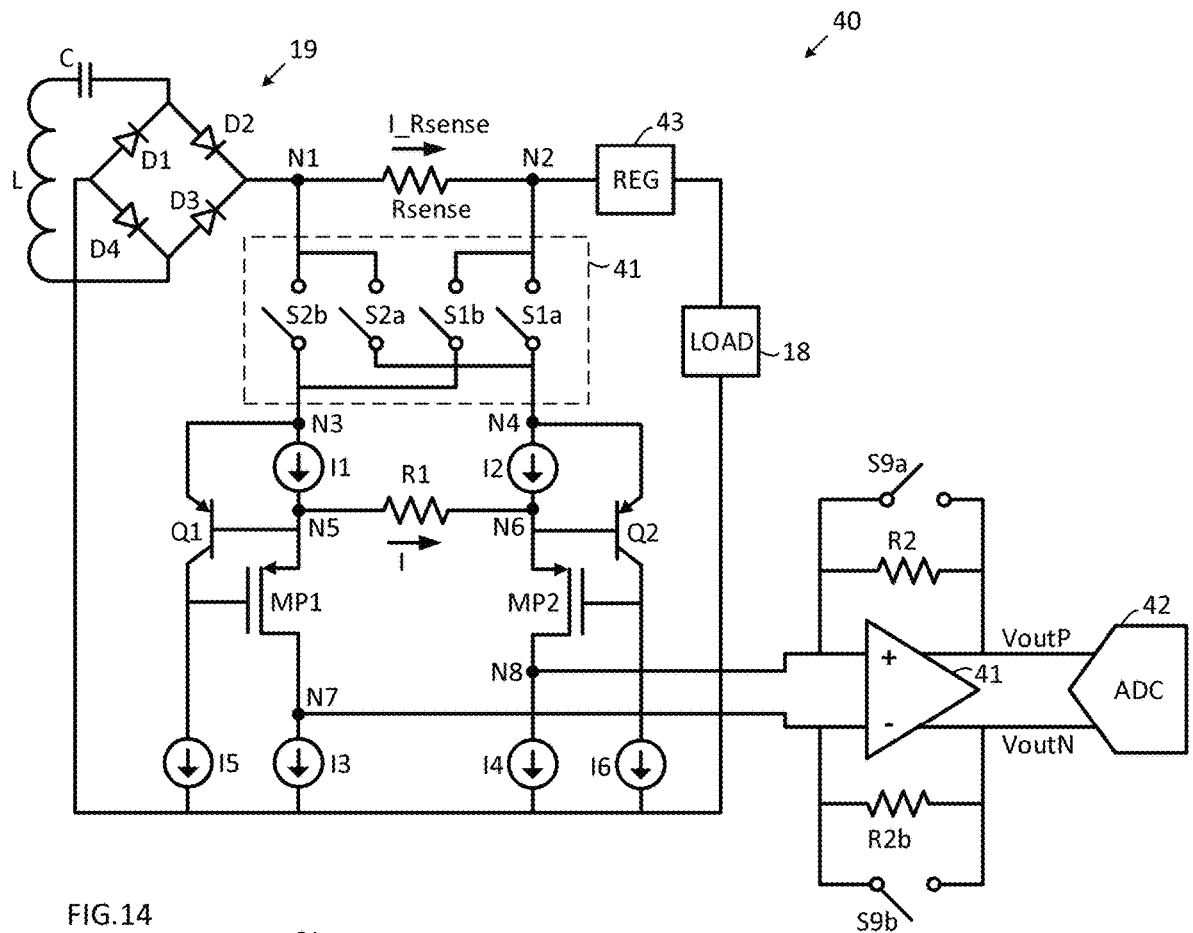
FIG.14
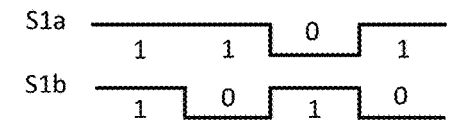
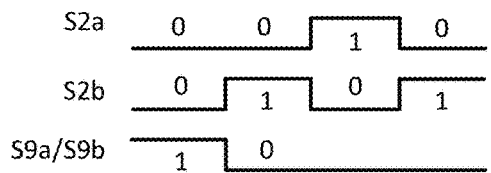
FIG.15
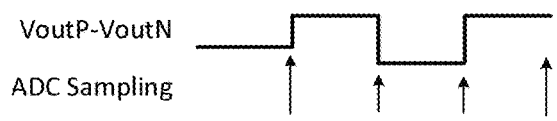

VERTICAL METAL SENSING METHOD FOR DC-DC CONVERTER

RELATED APPLICATION

This application is a continuation-in-part of U.S. application for patent Ser. No. 17/680,666, filed Feb. 25, 2022, the contents of which are incorporated by reference in their entirety.

TECHNICAL FIELD

This disclosure is related to the field of DC-DC voltage converters and, more particularly, to hardware and methods for sensing the input current and output voltage/current in switched capacitor DC-DC voltage converters.

BACKGROUND

A sample known switched capacitor DC-DC converter 10 is now described with reference to FIGS. 1-2. The DC-DC converter 10 has an input (shown as node A) connected to an input pin to receive a bus voltage VBUS. An n-channel transistor QSW has its source connected to node A, its drain connected to node B, and its gate controlled by power control circuitry 1. A current sensing circuit 2 is connected between nodes A and B, with node B being connected to a PMID pin. Ripple currents occur in the switched capacitor DC-DC converter 10 due to the switching operation, and therefore the switching portion of the DC-DC converter 10 is split into two paths/phases to reduce ripple, one path being from node C (connected to node B) to the output pin VOUT, and the other path being from node D (connected to node B) to the output pin VOUT.

In greater detail, the first path includes: an n-channel transistor QCH1 having its drain connected to node C, its source connected to a CTOP SC1 pin, and its gate connected to a switch control circuit 3; an n-channel transistor QDH1 having its drain connected to the CTOP SC1 pin, its source connected to the output pin VOUT, and its gate connected to the switch control circuit 3; an n-channel transistor QCL1 having its drain connected to the output pin VOUT, its source connected to a CBOT SC1 pin, and its gate connected to a switch control circuit 5; and an n-channel transistor QDL1 having its drain connected to the CBOT SC1 pin, its source connected to ground, and its gate connected to the switch control circuit 5.

In greater detail, the second path includes: an n-channel transistor QCH2 having its drain connected to node D, its source connected to a CTOP SC2 pin, and its gate connected to a switch control circuit 4; an n-channel transistor QDH2 having its drain connected to the CTOP SC2 pin, its source connected to the output pin VOUT, and its gate connected to the switch control circuit 4; an n-channel transistor QCL2 having its drain connected to the output pin VOUT, its source connected to a CBOT SC2 pin, and its gate connected to a switch control circuit 6; and an n-channel transistor QDL2 having its drain connected to the CBOT SC2 pin, its source connected to ground, and its gate connected to the switch control circuit 6.

Input current is commonly measured at either node A or node B. Generally, current measurement at node B is desirable because it also tracks current incoming from the PMID pin. However, due to physical layout constraints, node B may not be readily accessible, and therefore the current at nodes C and D (which are readily accessible) is instead measured and summed. However, despite the use of two paths to reduce the ripple current, an undesirable amount of ripple current it still present.

These ripple current issues will now be discussed greater in detail, first for the case of a single path switched capacitor DC-DC converter, and then for a dual path switched capacitor DC-DC converter.

Refer to the example of FIG. 3, showing a simple known switched capacitor DC-DC converter 11 formed by a sense resistor Rs connected between an input IN and a first terminal of a first switch S1, a capacitor C connected between a second terminal of the first switch S1 and ground, and a second switch S2 connected between the capacitor C and the output OUT. A timing diagram showing operation of this circuit may be seen in FIG. 4, where a ripple (spike in magnitude) can be observed in the current I_Rs flowing through the sense resistor Rs at each instance of switch S1 closing.

Refer now to the example of FIG. 5, showing a simple known dual path switched capacitor DC-DC converter 12 formed by: a first sense resistor Rs1 connected between an input IN and a first terminal of a first switch S11, a first capacitor C1 connected between a second terminal of the first switch S11 and ground, and a second switch S21 connected between the capacitor C and the output OUT; and a second sense resistor Rs2 connected between the input IN and a first terminal of a third switch S12, a second capacitor C2 connected between a second terminal of the third switch S12 and ground, and a fourth switch S22 connected between the second capacitor C2 and the output OUT. A timing diagram showing operation of this circuit may be seen in FIG. 6, where a ripple can be observed in the current I_Rs1 flowing through sense resistor Rs1 at each instance of switch S11 closing and can be observed in the current I_Rs2 flowing through the sense resistor Rs2 at each instance of switch S12 closing.

Although the ripples in I_Rs1 and I_Rs2 are lesser in magnitude than the ripple in I_Rs (from FIG. 4), they are still present. Current sensing techniques therefore focus on filtering these ripple currents.

Turn now to the prior art current sensor 13 example shown in FIG. 7. Assume here that the resistors Rs1 and Rs2 are the sense resistors of the dual path switched capacitor DC-DC converter 12 of FIG. 5, with the rest of the dual path switched capacitor DC-DC converter 12 not being shown for brevity. The current sensor 13 includes a first amplifier 14 having the resistor Rs1 connected across its input terminals and providing output through a low-pass filter to a first input of a multiplexer 16, and a second amplifier 17 having the resistor Rs2 connected across its input terminals and providing output through a low-pass filter 18 to a second input of the multiplexer (MUX) 16. Since the currents I_Rs1 and I_Rs2 are opposite in phase, the MUX 16 is set to accordingly switch between passing those currents such that the output of the MUX 16 is effectively a sum of the currents I_Rs1 and I_Rs2. An analog to digital converter (ADC) 19 digitizes the output of the MUX 16 to produce a digital code representative of the sum of the sense currents I_Rs1 and I_Rs2.

In operation, the frequency of the currents I_Rs1 and I_Rs2 will be approximately equal to the switching frequency of the switches of the dual path switched capacitor DC-DC converter. Therefore, to sense the voltage across the sense resistors Rs1 and Rs2 with the ADC 19, the sampling frequency of the ADC 19 would need to be substantially higher than the frequency of the currents I_Rs1 and I_Rs2 to avoid aliasing, increasing cost and complexity. Thus, the low-pass filters 15 and 18 are used to average the currents I_Rs1 and I_Rs2 to thereby remove their high-frequency components, enabling the use of a slower ADC.

While this design of the current sensor 13 can produce acceptable results, notice that it utilizes two amplifiers 14 and 17, two low-pass filters 15 and 18, and a MUX 19. These low-pass filters 15 and 18 may be relatively large depending on the switching frequency of the dual path switched capacitor DC-DC converter. Given this, the design of the current sensor 13 may be much larger than desired (particularly if the amplifiers 14 and 17 are fully differential), and further development is therefore needed.

SUMMARY

Disclosed herein is a circuit including: a first switching element directly electrically connected to a first node along a first conductive path; a second switching element directly electrically connected to the first node along a second conductive path; and an output bump directly electrically connected to the first node along a third conductive path.

The third conductive path includes: a first unbroken conductive stack extending along the first and second conductive paths and directly electrically connected between the first and second switching elements; a first broken conductive stack portion directly electrically connected to the first switching element and extending toward, but not reaching, the first node; wherein the first broken conductive stack portion is carried by the first unbroken conductive stack and is in electrical connection therewith; a second broken conductive stack portion directly electrically connected to the second switching element and extending toward, but not reaching, the first node, such that the first and second broken conductive stack portions are separated by a break; wherein the second broken conductive stack portion is carried by the first unbroken conductive stack and is in electrical connection therewith; a central conductive stack portion directly electrically connected between the first node and the output bump, the central conductive stack portion being carried partially by the first unbroken conductive stack within the break and being in electrical connection with the first unbroken conductive stack; and a second conductive stack extending between the first unbroken conductive stack at the first node and the output bump, the second conductive stack being electrically connected to the first unbroken conductive stack; wherein the central conductive stack portion is also carried partially by the second conductive stack within the break and is electrical connected to the second conductive stack.

The second conductive stack may be a second unbroken conductive stack.

The central conductive stack may be formed of: a plurality of resistive pillars spaced apart from one another along the third conductive path between the first node and the output bump, each resistive pillar being carried by the second unbroken conductive stack and being in electrical contact therewith; and an unbroken metal sheet carried by and in electrical contact with the plurality of resistive pillars, the unbroken metal sheet extending along the third conductive path between the first node and the output bump; wherein resistances of the resistive pillars of the plurality thereof are substantially greater than resistances of the second unbroken conductive stack.

Each of the plurality of resistive pillars may be formed of a first conductive sheet carried by and electrically connected to the second unbroken conductive stack, and a second conductive sheet carried by and electrically connected to the first conductive sheet, the second conductive sheet extending between the first conductive sheet and the unbroken metal sheet so that current flows from the second unbroken conductive stack into the first conductive sheet, through the second conductive sheet, into the unbroken metal sheet.

The first conductive sheet may be carried atop a first via layer sandwiched between the first conductive sheet and the second unbroken conductive stack, the first via layer electrically connecting the second unbroken conductive stack to the first conductive sheet.

The second conductive sheet may be carried atop a second via layer sandwiched between the second conductive sheet and the first conductive sheet, the second via layer electrically connecting the first conductive sheet to the second conductive sheet.

The unbroken metal sheet may be carried atop a third via layer sandwiched between the unbroken metal sheet and the second conductive sheet, the third via layer electrically connecting the second conductive sheet to the unbroken metal sheet.

The central conductive stack may be formed of: a resistive pillar stack extending along the third conductive path between the first node and the output bump, the resistive pillar stack being carried by the second unbroken conductive stack and being in electrical contact therewith; and an unbroken metal sheet carried by and in electrical contact with the resistive pillar stack, the unbroken metal sheet extending along the third conductive path between the first node and the output bump; wherein resistances of the resistive pillars of the plurality thereof in a direction from the second unbroken conductive stack to the unbroken metal sheet are substantially greater than a resistance of the second unbroken conductive stack.

The resistive pillar stack may be formed by: a first unbroken conductive sheet carried by and electrically connected to the second unbroken conductive stack, the first unbroken conductive sheet extending along the third conductive path between the first node and the output bump; a second unbroken conductive sheet carried by and electrically connected to the first unbroken conductive sheet, the second unbroken conductive sheet extending along the third conductive path between the first node and the output bump; and the second unbroken conductive sheet extending between the first unbroken conductive sheet and the unbroken metal sheet so that current flows from the second unbroken conductive stack into the first unbroken conductive sheet, through the second unbroken conductive sheet, into the unbroken metal sheet.

Also disclosed herein is a current sensor, including: a sense resistor coupled between first and second terminals; and an amplification circuit. The amplification circuit includes: an amplifier having inputs coupled to the first and second terminals and an output at which a voltage representative of the input is produced; a first resistor coupled to at least one of the inputs of the amplifier; and a second resistor coupled to at least one of the inputs of the amplifier.

A gain of the amplification circuit is based upon a resistance of the second resistor and a ratio of a resistance of the sense resistor to a resistance of the first resistor. The first resistor and the sense resistor are arranged in a ratiometric relationship such that the first resistor and sense resistor change temperature substantially equally during operation and such that the first resistor and sense resistor vary substantially equally in resistance over temperature.

The sense resistor includes: a plurality of resistive pillars spaced apart from one another along a conductive path between the first and second terminals, with a first of the resistive pillars being directly electrically connected to the first terminal and a last of the resistive pillars being directly electrically connected to the second terminal; a plurality of conductive stacks spaced apart from one another along the conductive path between the first and second terminals, with a first of the conductive stacks carrying and being in direct electrical contact with the first of the resistive pillars, a last of the conductive stacks carrying and being in direct electrical contact with the last of the resistive pillars, and each other of the conductive stacks carrying and being in direct electrical contact with two adjacent ones of the resistive pillars; and an unbroken metal sheet carried by and in electrical contact with the plurality of resistive pillars, the unbroken metal sheet extending along the conductive path between the first and second terminals; wherein resistances of the resistive pillars of the plurality thereof are substantially greater than resistances of the plurality of conductive stacks.

Each of the plurality of resistive pillars may be formed of a first conductive sheet carried by and electrically connected to its associated conductive stack, and a second conductive sheet carried by and electrically connected to the first conductive sheet, the second conductive sheet extending between the first conductive sheet and the unbroken metal sheet so that current flows from the associated conductive stack into the first conductive sheet, through the second conductive sheet, into the unbroken metal sheet.

BRIEF DESCRIPTION OF THE DRAWINGS

FIG. 14 is a schematic block diagram of another current sensor disclosed herein such as may be used to sense the current through a sense resistor.

FIG. 15 is a timing diagram showing the switching of the current sensor of FIG. 14 in operation.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete device unless the contrary is stated, and is not simply an electrical lead between two points. Thus, any described resistor or resistance coupled between two points has a greater resistance than a lead between those two points would have, and such resistor or resistance cannot be interpreted to be a lead. Similarly, any described capacitor or capacitance is a discrete device unless the contrary is stated, and is not a parasitic unless the contrary is stated. Moreover, any described inductor or inductance is a discrete device unless the contrary is stated, and is not a parasitic unless the contrary is stated.

Figure 1:
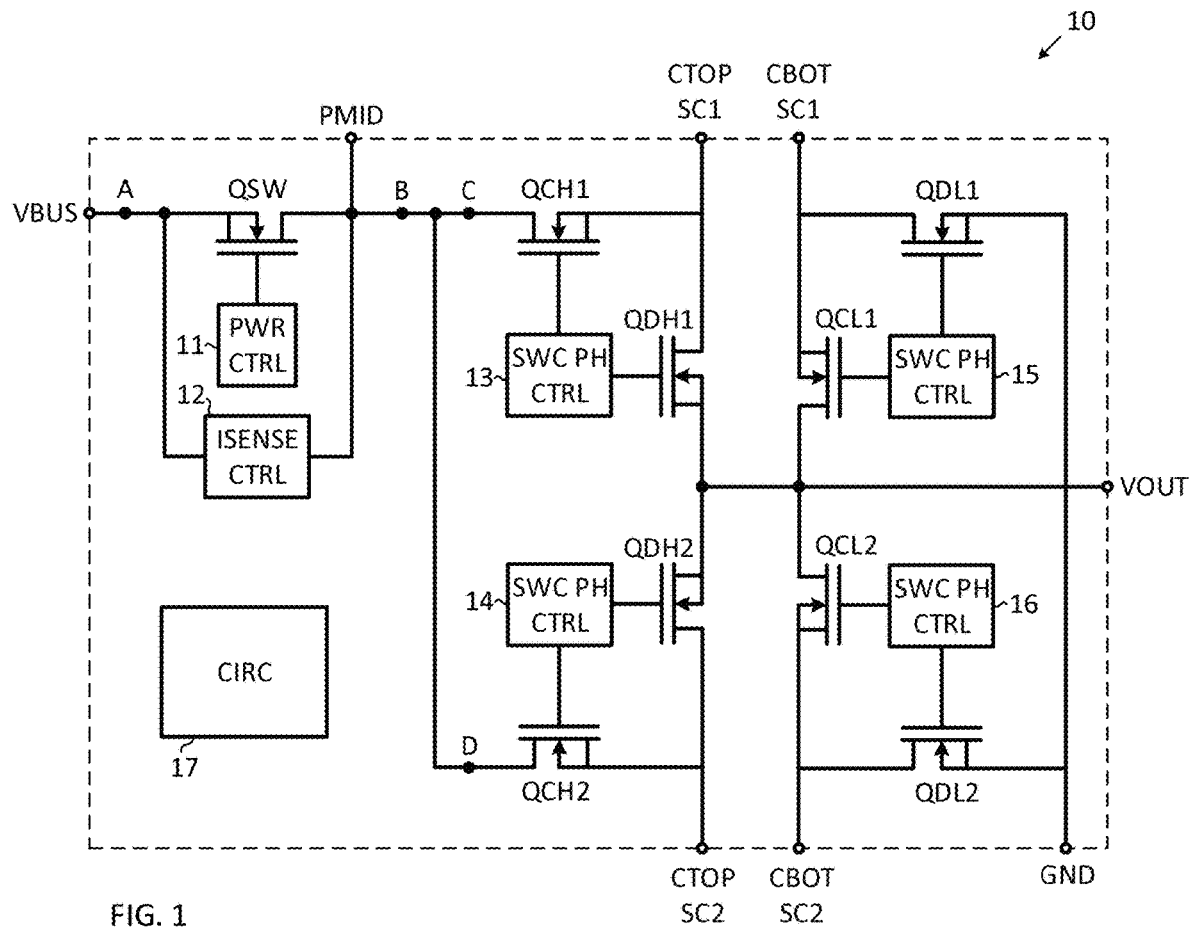
FIG. 1 is a schematic block diagram of a known switched capacitor DC-DC converter including current sensing.
Figure 2:
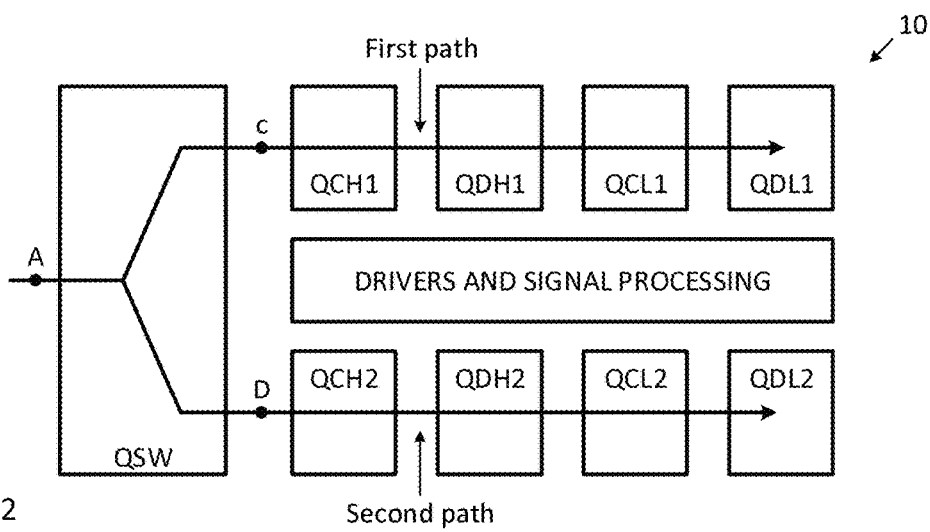
FIG. 2 is a diagrammatical representation of the direction of current flow in the switched capacitor DC-DC converter of FIG. 1.
Figure 3:
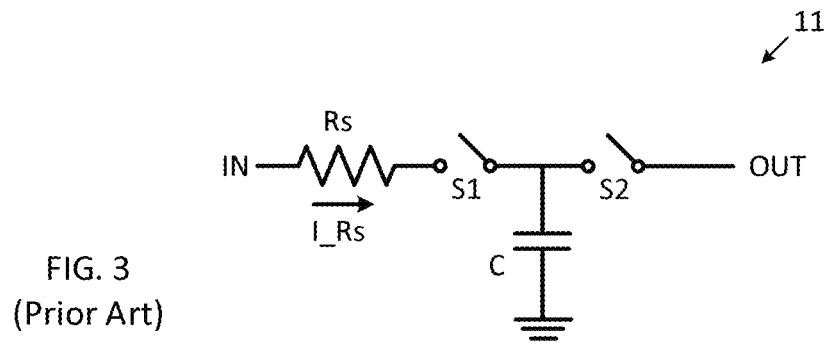
FIG. 3 is a schematic diagram of a known single-path switched capacitor DC-DC converter.
Figure 4:
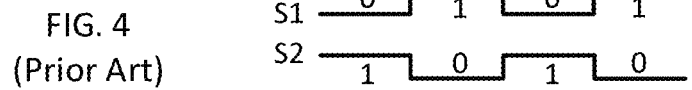
FIG. 4 is a timing diagram showing operation of the switched capacitor DC-DC converter of FIG. 3 in operation.
Figure 5:
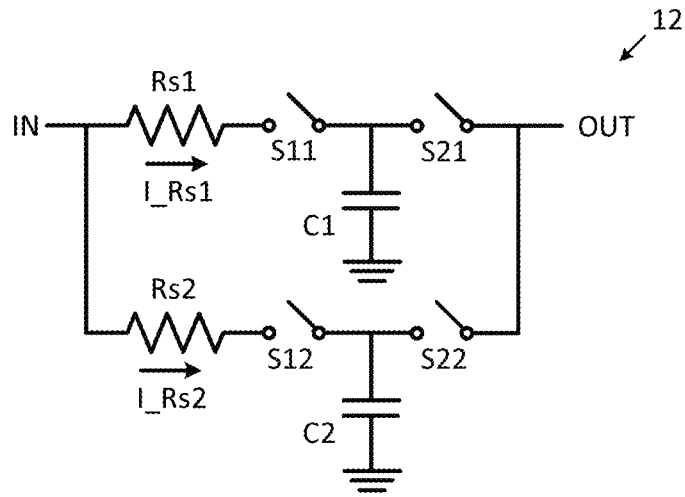
FIG. 5 is a schematic diagram of a known dual-path switched capacitor DC-DC converter.
Figure 6:
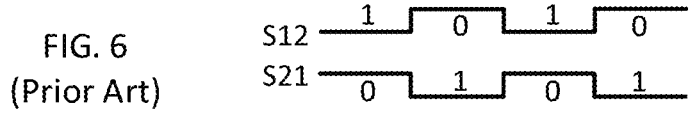
FIG. 6 is a timing diagram showing operation of the switched capacitor DC-DC converter of FIG. 5 in operation.
Figure 8:
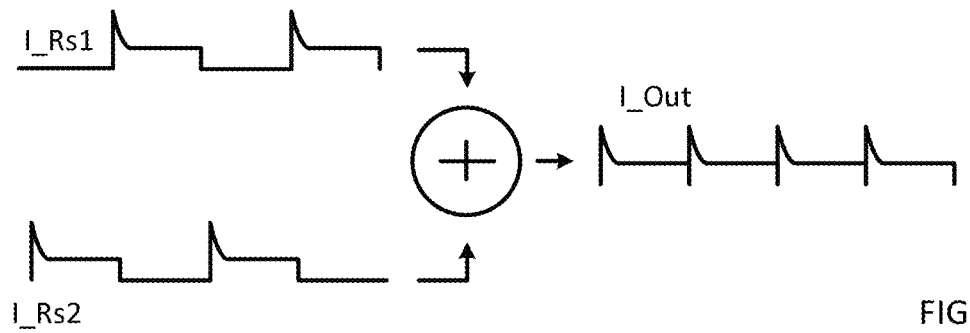
FIG. 8 is a diagram showing the principle of operation desired for the current sensor described herein for use in a dual-path switched capacitor DC-DC converter such as that of FIG. 5.

Referring now to FIG. 8, keeping in mind the dual path switched capacitor DC-DC converter 12 of FIG. 5, the goal for a current sensor is to sense the current I_Rs1 flowing through sense resistor Rs1 and the current I_Rs2 flowing through sense resistor Rs2, then sum I_Rs1 and I_Rs2 to produce an output current I_Out that is representative of the input current to the dual path switched capacitor DC-DC converter 12.

Figure 9:
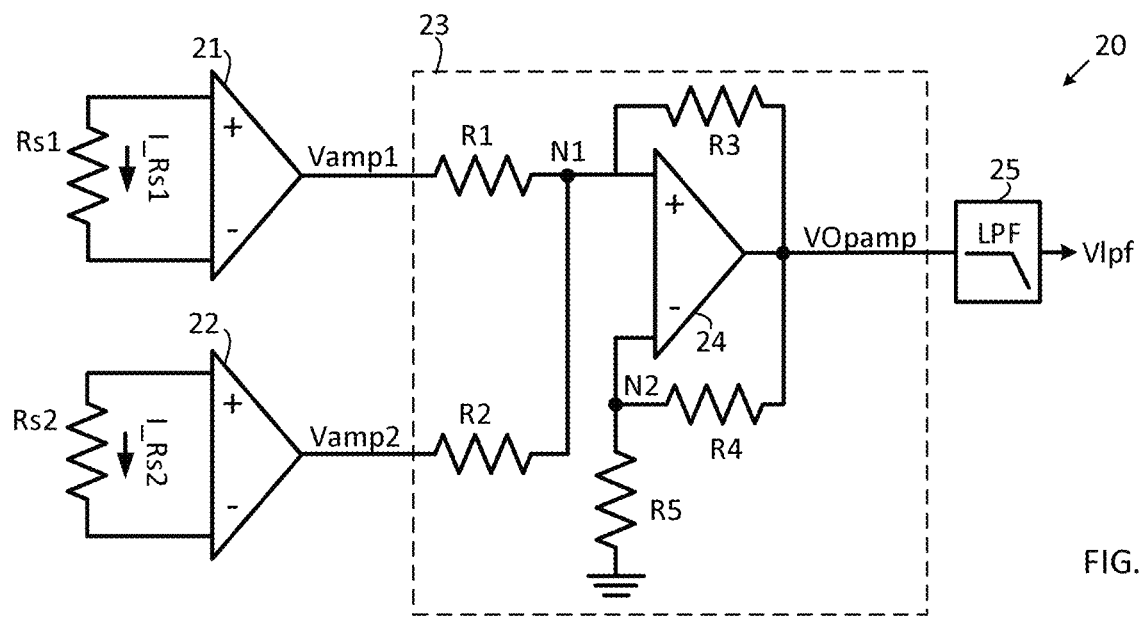
FIG. 9 is a schematic block diagram of a current sensor disclosed herein for use in a dual-path switched capacitor DC-DC converter such as that of FIG. 5.

A current sensor 20 that performs this functionality is now described with reference to FIG. 9. The current sensor 20 includes a first amplifier 21 having its inputs connected across the sense resistor Rs1, and a second amplifier 22 having its inputs connected across the sense resistor Rs2. The outputs of the amplifiers 21 and 22 are connected to the inputs of a summing amplifier 23.

The summing amplifier 23 includes a first resistor R1 connected between the output of the amplifier 21 and node N1, and a second resistor R2 connected between the output of the amplifier 22 and node N1. A third amplifier 24 (e.g., an operational amplifier) has its non-inverting terminal connected to node N1 and its inverting terminal connected to node N2. A third resistor R3 is connected between node N1 and the output of the third amplifier 24, and a fourth resistor R4 is connected between node N2 and the output of the third amplifier 24. A fifth resistor R5 is connected between node N2 and ground.

A low-pass filter 25 filters the output of the summing amplifier 23.

In operation, the amplifier 21 outputs a voltage Vamp1 indicative of the current I_Rs1 through the sense resistor Rs1, and the amplifier 22 outputs a voltage Vamp2 indicative of the current I_Rs1 through the sense resistor Rs2. The summing amplifier 23 sums the voltages across the sense resistors Rs1 and Rs2 to produce the voltage VOpamp as output, which is turn filtered by the low-pass filter 25. The low-pass filter 25 provides the output Vlpf that can be read and from which the input current to the dual path switched capacitor DC-DC converter 12 can be determined.

Figure 7:
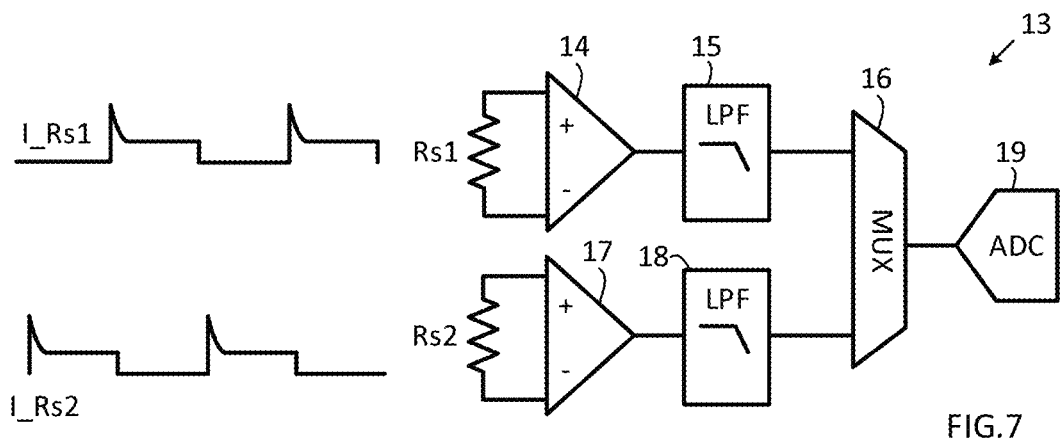
FIG. 7 is a schematic block diagram of a known current sensor for use in a dual-path switched capacitor DC-DC converter such as that of FIG. 5.

The result of the summing performed by the summing amplifier 23 is that the frequency of the ripple in the output signal Vlpf is twice that of the frequency of the switching frequency of the dual path switched capacitor DC-DC converter 12. As a result, the cut-off frequency of the low-pass filter 25 is doubled, having the result of reducing the resistance and capacitance of the resistor and capacitor within the low-pass filter 25, in turn reducing the physical size of the resistor and capacitor by half. Therefore, as compared to the current sensor 13 of FIG. 7, the physical area occupied by the low-pass filter 25 of the current sensor 20 is one quarter (since there is one low-pass filter instead of two, and since the resistor and capacitor area of that one low-pass filter is half that of the resistor and capacitor area of either of the low-pass filters of the current sensor 13). This greatly reduces the overall area consumed by the current sensor 20 as opposed to the prior art current sensor 13, which is advantageous in many applications in which it is desired to conserve area.

Figure 10:
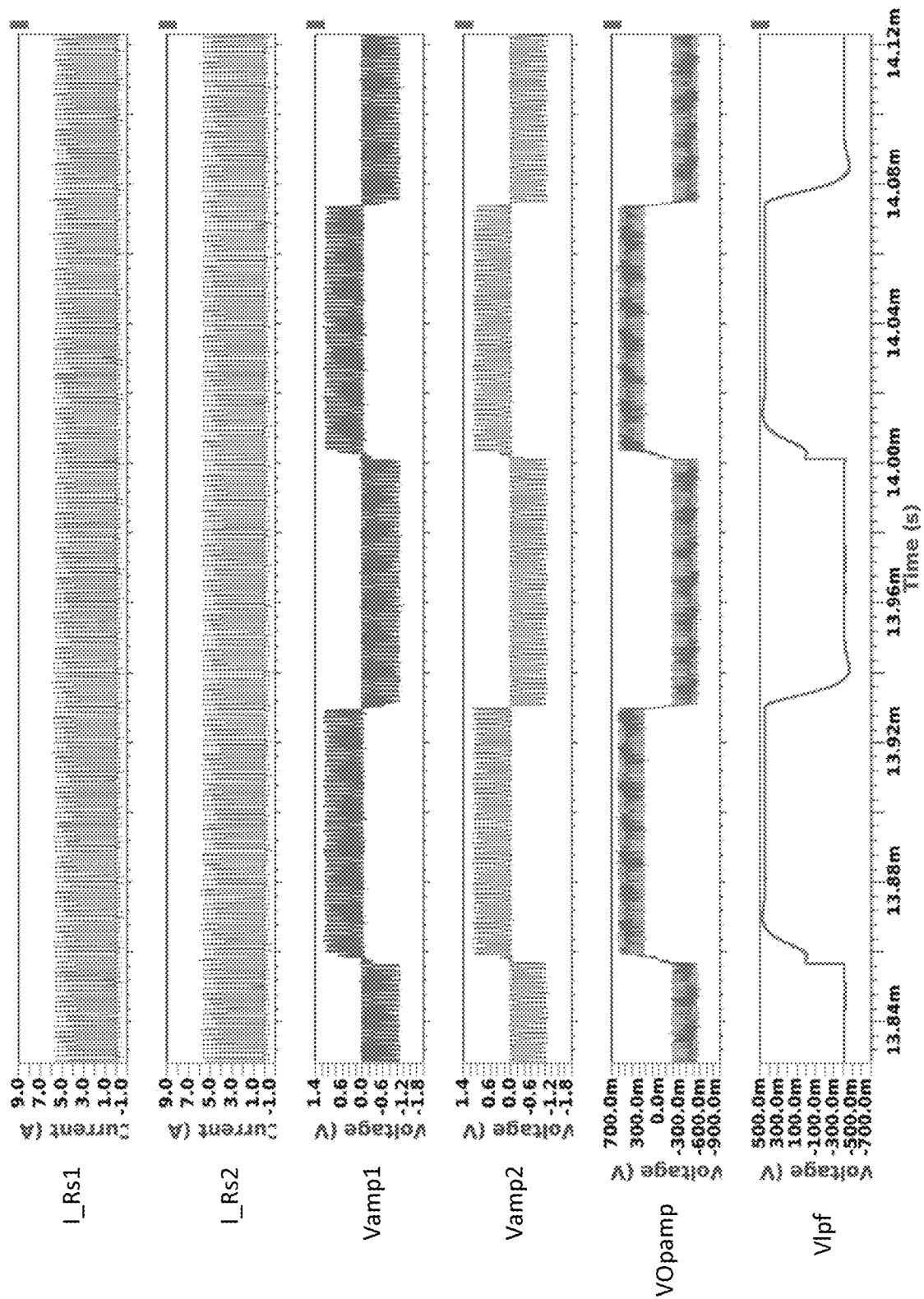
FIG. 10 is a graph showing full current and voltage waveforms within the current sensor of FIG. 9 during operation.
Figure 11:
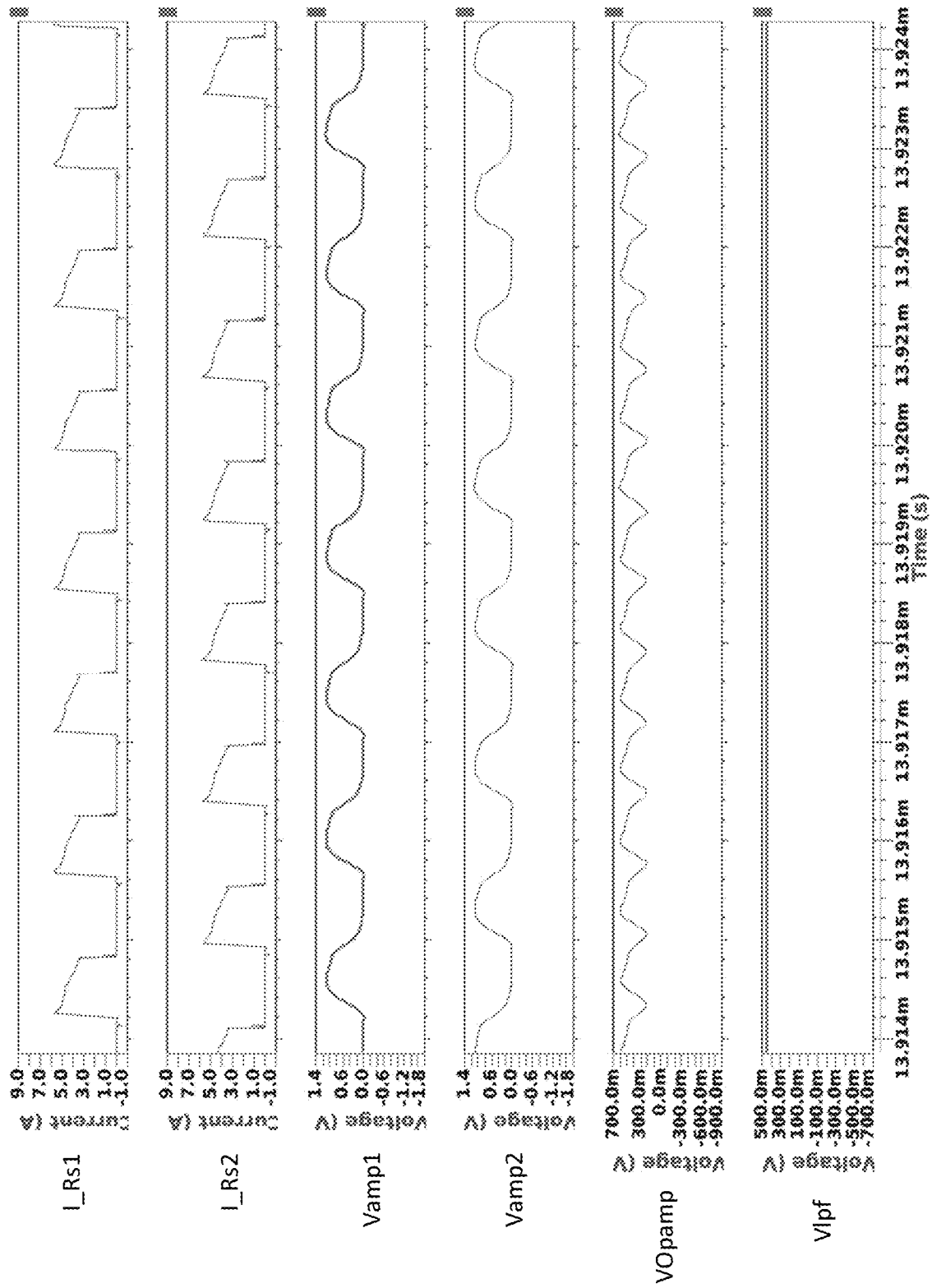
FIG. 11 is a graph showing greatly enlarged partial current and voltage waveforms within the current sensor of FIG. 9 during operation.

Waveforms showing the operation of the current sensor 20 may be seen in FIGS. 10-11. Full waveforms may be seen in FIG. 10, and greatly enlarged partial waveforms may be seen in FIG. 11.

Figure 12:
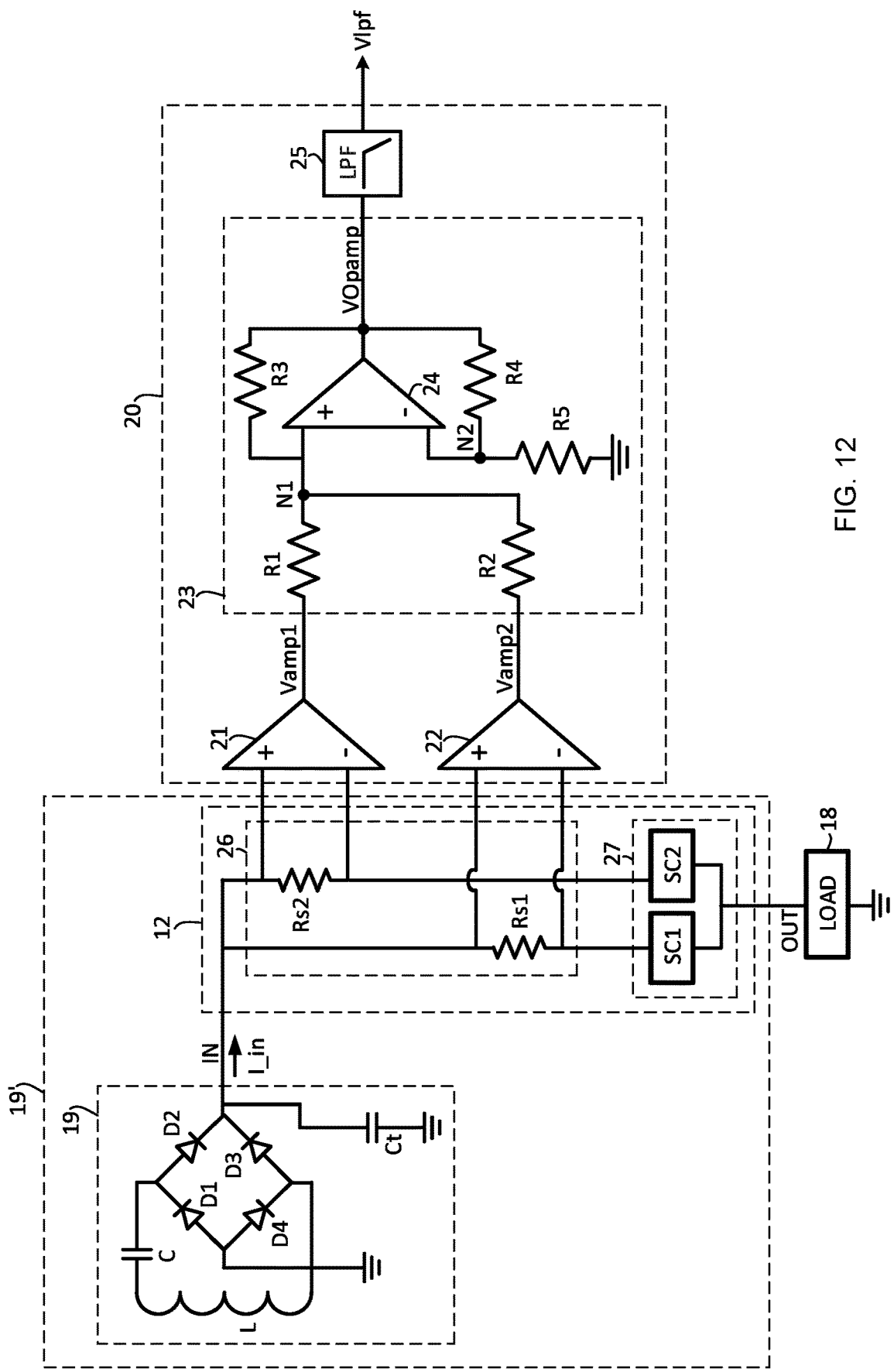
FIG. 12 is a schematic block diagram of the current sensor of FIG. 9 as implemented in a sample dual-path switched capacitor DC-DC converter.

An example implementation of the current sensor 20 used to detect the input current I_in to a dual path switched capacitor DC-DC converter 12 from a power source 19 is shown in FIG. 12. Notice the single input node IN of the dual path switched capacitor DC-DC converter 12 receiving the input current I_in, which is split into two paths and fed to a switching block 27 that contains switched capacitor circuits SC1 and SC2, and that the output of the switched capacitor circuits SC1 and SC2 is combined at an output node OUT to power a load 18, such as a voltage regulator. A sense resistor Rs1 is connected between the input node IN and the switched capacitor circuit SC1 and a sense resistor Rs2 is connected between the input node IN and the switched capacitor circuit SC2.

As understood by those of skill in the art, the power source 19 includes a rectifying bridge formed by diodes D1-D4 that rectify a current induced in coil L by a time-varying signal and charge a tank capacitor Ct.

As will also be understood by those of skill in the art, the sense resistors Rs1 and Rs2 may be external discrete resistors or may be on-chip resistors located in a spaced apart fashion from the resistors R1-R5 of the current sensor 20. It is known that the resistance of resistors varies over temperature. Thus, the variance of the resistance of the sense resistors Rs1 and Rs2 during operation will be different than that of the resistors R1-R5 because they will be exposed to different temperatures, particularly in the case where the sense resistors Rs1 and Rs2 are external. This may reduce the precision of the current sensor 20. In general, to combat this, the resistors R1-R5 may be precisely matched and/or precisely trimmed so as to help provide a precise known gain from the operational amplifier 24.

This can be costly and add to production time, especially when Rs1 and Rs2 are off-chip as any compensation is performed at module level after the chip has been assembled in its environment. As such, further developments have been made, and will now be discussed. To combat this, the resistors may be on-chip and may be laid out together in a single integrated circuit substrate in a ratiometric layout such that the sense resistors Rs1 and Rs2, and a selected one or ones of the resistors R1-R5 of the current sensor 20, change the same over temperature, while certain other one or ones of the resistors R1-R5 are designed to have a temperature coefficient close to zero and not vary much over temperature, and precise matching of ones of the resistors R1-R5 is not performed. In fact, this concept can be applied to any current sensing application and need not be limited to use in current sensing within switched capacitor DC-DC converters.

Figure 13:
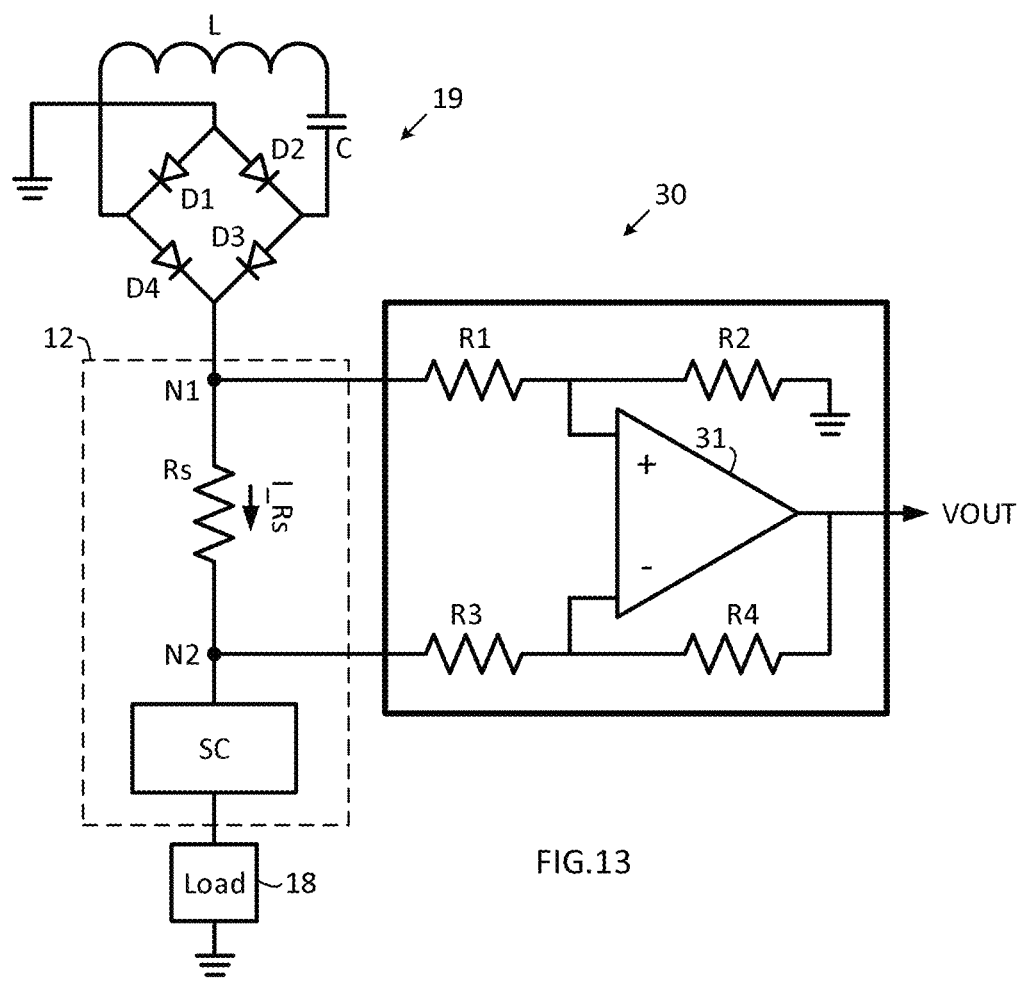
FIG. 13 is a schematic block diagram of a current sensor disclosed herein such as may be used to sense the current through a sense resistor.

For ease of explanation, first consider the simplified example of a circuit including a current sensor 30 shown in FIG. 13. Here, a power source 19 provides an input current to a switched capacitor DC/DC converter 12, the converter including an input sense resistor Rs through which the input current flows (labelled as I_Rs) and a switched capacitor circuit SC, the converter 12 in turn powering a load. The sense resistor Rs is connected between nodes N1 and N2. The current sensor 30 senses the current I_Rs and generates an output voltage VOUT indicative of the current I_Rs. The current sensor 30 includes an operational amplifier 31 having a non-inverting terminal connected to node N1 through resistor R1, with a resistor R2 being connected between the non-inverting terminal and ground. The operational amplifier 31 has an inverting terminal connected to node N2 through resistor R3, with resistor R4 being connected between the inverting terminal and the output of the operational amplifier 31.

The sense resistor Rs is external to the current sensing circuit 30. Therefore, the resistance of the sense resistor Rs and the resistance of the resistors R1 and R2 of the current sensor 30 change differently over temperature, degrading precision of the output voltage VOUT. To combat this, resistors R1, R2, R3, and R4 are matched (for example via trimming) to help ensure a precise gain, with variations in the resistance of the sense resistor Rs over temperature remaining un-compensated. As stated, this can be costly and add to production time, and is therefore undesirable. Other known ways of addressing this issue are also undesirable.

An embodiment of current sensor 40 utilizing a ratiometric layout of its resistors to address these issues is now described with reference to FIG. 14. First, the current sensor 40 will be described, and thereafter the specific substrate-level layout details of the resistors will be described.

The current sensor 40 receives an input current I_Rsense from a power source 19 (illustratively a rectifying bridge), with the current sensing being connected to the power source 19 at node N1. A sense resistor Rsense (e.g., 4 mΩ) is connected between nodes N1 and N2. A regulator receives input from node N2 and provides output to a load 18.

A chopper 41 is coupled between nodes N1/N2 and nodes N3/N4. The chopper 41 includes a switch S1a connected between nodes N2 and N4, and a switch S1b connected between nodes N2 and N3. The chopper 41 also includes a switch S2a connected between nodes N1 and N4, and a switch S2b connected between nodes N1 and N3.

A current source I1 is connected between nodes N3 and N5 and is arranged to sink current from node N3 and source current to node N5. A high voltage p-channel transistor MP1 has its source connected to node N5, its drain connected to node N7, and its gate connected to a collector of PNP transistor Q1. A current source 13 is connected between node N7 and ground, with current source 13 sinking current from node N7 and sourcing current to ground. The PNP transistor Q1 has its collector also connected to a current source IS which sinks current from the collector of Q1 and sources current to ground. The emitter of PNP transistor Q1 is connected to node N3 and the base of PNP transistor Q1 is connected to node N5.

A current source 12 is connected between nodes N4 and N6 and is arranged to sink current from node N4 and source current to node N6. A high voltage p-channel transistor MP2 has its source connected to node N6, its drain connected to node N8, and its gate connected to a collector of PNP transistor Q2. A current source 14 is connected between node N8 and ground, with current source 14 sinking current from node N8 and sourcing current to ground. The PNP transistor Q2 has its collector also connected to a current source 16 which sinks current from the collector of Q2 and sources current to ground. The emitter of PNP transistor Q2 is connected to node N4 and the base of PNP transistor Q2 is connected to node N6.

A resistor R1 (e.g., 2 kΩ) is connected between nodes N5 and N6.

A differential amplifier 41 has its non-inverting terminal connected to node N8 and its inverting terminal connected to node N7. A resistor R2 (e.g., 50 kΩ) is connected between node N8 and a first output of the amplifier 41, and a resistor R2b (e.g., 50 kΩ) is connected between node N7 and a second output of the amplifier 41. A switch S9a is connected between node N8 and the first output of the amplifier 41, and a switch S9b is connected between node N7 and the second output of the amplifier 41. The outputs of the amplifier 41 are also differential, with a first output voltage VoutP being generated at the first output and a second output voltage VoutN being generates at the second output. An analog to digital converter 42 digitizes the differential signal represented by VoutP and VoutN.

In operation, the voltage across Rsense resulting from the input current I_Rsense is reproduced across the resistor R1, with the high-voltage transistors MP1 and MP2 performing level shifting, and a differential current representative of the input current I_Rense being output by the drains of transistors MP1 and MP2 to the amplifier 41, which converts the differential current to a differential voltage represented by VoutP and VoutN.

The switching sequence of the chopper 41 is shown in FIG. 15. At the beginning of each cycle, as shown, switches S1a and S1b and S9a and S9b are closed while switches S2a and S2b are open, serving to auto-zero the amplifier 41. Thereafter, alternate switching of S1a/S2a and S1b/S2b is performed at the ADC sampling rate, with S1a/S2a being opposite in phase to one another at any given time and S1b/S2b being opposite in phase to one another at any given time.

The gain of the current sensor 40 can be calculated as:

$$\frac{R2}{R1} \times Rsense \times I$$

Notice that if variance in the resistance R1 over temperature is equal to variance in resistance Rsense over temperature, those variances will cancel each other out. As such, it is desired for R1 and Rsense to track one another over temperature. Also, observe that the gain is subject to variations in R2, therefore R2 is designed so as to have a thermal constant as close to zero as possible (e.g., R2 is a polyresistor) so that the gain of the current sensor 40 can be tuned by trimming R2. One way to yield a zero thermal constant is to divide R2 into two resistors, constructed from materials having opposite temperature coefficients (e.g., divided into a resistor R2_1 having a temperature coefficient of +1% and a resistor R2_2 having a temperature coefficient of −1%). As an alternative to using a resistor R2, a 1/sC switched capacitance with extremely low temperature dependency governed by C and using an available stable switching frequency may be used.

Figure 16:
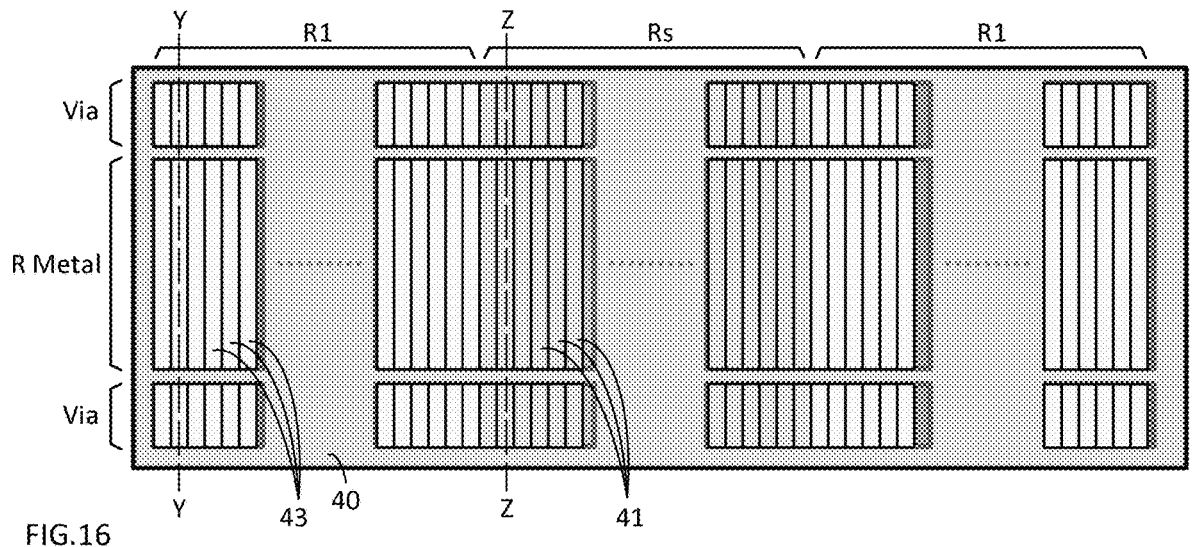
FIG. 16 is a top plan view showing on-silicon formation of the resistors R1 and Rs of the current sensor of FIG. 14.

A top plan view of the resistors R1 and Rs as formed on an integrated circuit substrate 40 is illustrated in FIG. 16. Rs is formed by multiple "elementary" resistor structures connected in parallel, while R1 is formed by multiple "elementary" resistor structures connected in series. The elementary resistor structures are multi-layer, and as can be observed in FIG. 16, the elementary resistor structures forming the sense resistor Rs are surrounded on two sides by the elementary resistor structures forming the resistor R1, such that Rs and R1 will heat and cool during operation to substantially the same temperature, at substantially the same rate.

Figure 17:
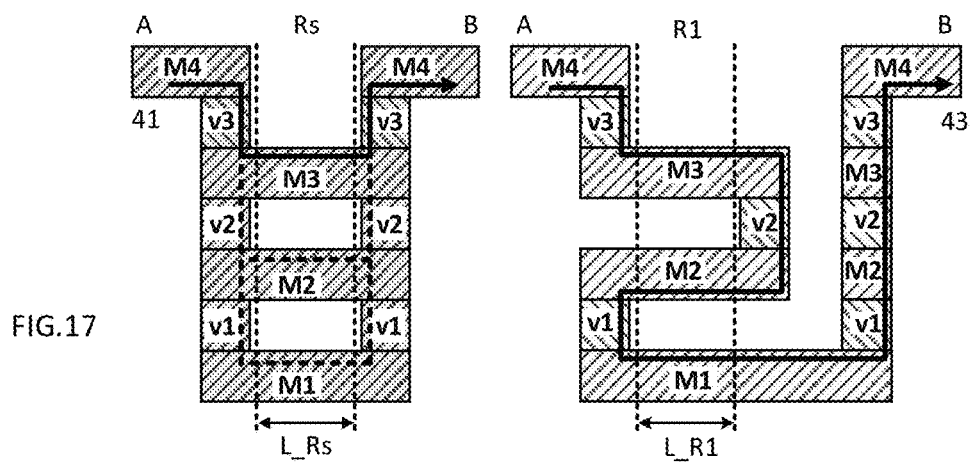
FIG. 17 is a cross sectional view of a first possible configuration for the elementary resistor units of R1 and Rs shown in FIG. 16 taken along the lines Y-Y and Z-Z.

In a first possible implementation shown in the cross section of FIG. 17 (which is a cross sectional view of the top plan view of FIG. 16 taken along lines Y-Y and Z-Z), the elementary resistor structures 41 and 43 forming R1 and Rs can be implemented from parallel metal sheets, where the length L_Rs of the metal sheets used to form the stackup of Rs is generally equal to the length L R1 of the metal sheets used to form the stackup of R1, and assuming the width W Rs of the metal sheets used to form the stackup of Rs is generally equal to the width W R1 of the metal sheets used to form the stackup of R1, and taking note that the resistance of the vias connecting the respective metal sheets of R1 and Rs is small but not negligible compared to that of the metal sheets (e.g., a few % of the resistance of the metal sheets), where the number of vias connecting the respective metal sheets of R1 and Rs are equal or as equal as possible.

To form the elementary resistor structures 41 used to form sense resistor Rs, as shown in FIG. 17, parallel metal sheets M1, M2, M3 that are equal in length, width, and thickness are connected to one another by vias (electrically connected in parallel), with metal sheet M1 being connected to metal sheet M2 at opposite sides by vias v1, and with metal sheet M2 being connected to metal sheet M3 at opposite sides by vias v2. In elementary resistor structures 41 not at the outer periphery or inner periphery (inner periphery being where a resistor structure 41 of the resistor R1 faces a resistor structure of the resistor Rs), terminals are formed by a pair of metal sheets M4 and connected to opposite ends of metal sheet M3 by vias v3, and these terminals M4 are connected to metal sheets M3 of adjacent resistor structures 41 by vias v3. Where an elementary resistor structure 41 is at the inner or outer periphery, it lacks the metal sheet M4 and via v3 at its side facing the inner or outer periphery.

The resulting resistance of the resistor Rs is:

$$Rs = \frac{1}{1/R_{M1} + 1/R_{M2} + 1/R_{M3}}$$

A desired number of such elementary resistor structures 41 are connected in parallel to yield the desired resistance of R1.

To form the elementary resistor structures 43 used to form resistor R1, as shown in FIG. 17, parallel metal sheets M1, M2, and M3 are connected to one another by vias (electrically connected in series). Here, metal sheets M2 and M3 are each divided into two pieces, referred to herein as left and right pieces of ease of reading FIG. 17, with the left pieces of M2 and M3 being equal in length, width, and thickness, the right pieces of M2 and M3 being equal in length, width and thickness. Metal sheet M1 is a single unitary metal sheet being negligibly greater in length than the combined length of left and right sheets M2 and the combined length of left and right M3. Metal sheet M1 is connected at one end to the left-side metal sheet M2 by a via v1 and is connected at its other end to the right-side metal sheet M2 by a via v1. Left side metal sheet M2 is connected to left side metal sheet M3 by a via v2 located at the opposite side of M2 as the via v1. Left side metal sheet M3 is connected to the left metal sheet M4 by a via v3, with the via v3 being located at the opposite side of M3 as the via v2. Right side metal sheet M2 is connected to right side metal sheet M3 by a via v2, and right side metal sheet M3 is connected to the right metal sheet M4 by a via v3.

The resulting resistance of the resistor R1 is:

$$R1 = R_{M1} + R_{M2} + R_{M3}$$

A desired number of such elementary resistor structures 43 are connected in series to yield the desired resistance of RS.

The structure proposed in FIG. 17 is advantageous for designing very low Rs and high R1 values within a small silicon area, as it benefits of the parallelism of the metals M1, M2, M3 in Rs and the serialization of M1, M2, M3 in R1. However, it can also be observed on structure 41 that given that the terminations are in metal M4, the current circulating from node A to node B within the elementary Rs may not distribute uniformly across M3, M2, M1 due to the via v2 and via v1 which are along the path. By construction of the series structure R1, a uniform current flows in M1, M2, M3. Therefore, Rs and R1 may suffer of unexpected matching as the part of contribution of M1, M2, M3 are even in R1 while M1 and M2 have a lesser contribution than in Rs, resulting in a relative higher contribution of M3. As the three metal layers M1, M2, M3 may behave differently, the structure proposed on FIG. 17 is not optimized against temperature effects, but presents a good trade-off for small areas.

Figure 18:
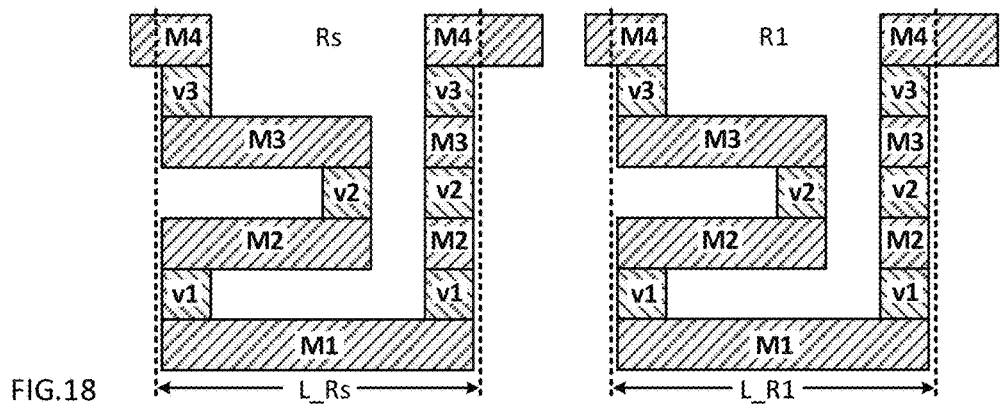
FIG. 18 is a cross sectional view of a second possible configuration for the elementary resistor units of R1 and Rs shown in FIG. 16 taken along the lines Y-Y and Z-Z.

In a second possible implementation shown in the cross section of FIG. 18 (which is also a cross sectional view of the top plan view of FIG. 16 taken along lines Y-Y and Z-Z), the elementary resistor structures 41 and 43 forming Rs and R1 can have the same structure, with the difference in resistance between R1 and Rs being in how many of the elementary resistor structures 41 and 43 are used to form each.

Here, to form the elementary resistor structures 43 used to form resistor R1, as shown in FIG. 18, parallel metal sheets M1, M2, and M3 are connected to one another by vias (electrically connected in series). Here, metal sheets M2 and M3 are each divided into two pieces, referred to herein as left and right pieces of ease of reading FIG. 17, with the left pieces of M2 and M3 being equal in length, width, and thickness, the right pieces of M2 and M3 being equal in length, width and thickness. Metal sheet M1 is a single unitary metal sheet being negligibly greater in length than the combined length of left and right sheets M2 and the combined length of left and right M3. Metal sheet M1 is connected at one end to the left-side metal sheet M2 by a via v1 and is connected at its other end to the right-side metal sheet M2 by a via v1. Left side metal sheet M2 is connected to left side metal sheet M3 by a via v2 located at the opposite side of M2 as the via v1. Left side metal sheet M3 is connected to the left metal sheet M4 by a via v3, with the via v3 being located at the opposite side of M3 as the via v2. Right side metal sheet M2 is connected to right side metal sheet M3 by a via v2, and right side metal sheet M3 is connected to the right metal sheet M4 by a via v3.

The resulting resistance of the resistor R1 is:

$$R1 = R_{M1} + R_{M2} + R_{M3}$$

To form the elementary resistor structures 41 used to form resistor Rs, as shown in FIG. 18, parallel metal sheets M1, M2, and M3 are connected to one another by vias (electrically connected in series). Here, metal sheets M2 and M3 are each divided into two pieces, referred to herein as left and right pieces of ease of reading FIG. 18, with the left pieces of M2 and M3 being equal in length, width, and thickness, the right pieces of M2 and M3 being equal in length, width and thickness. Metal sheet M1 is a single unitary metal sheet being negligibly greater in length than the combined length of left and right sheets M2 and the combined length of left and right M3. Metal sheet M1 is connected at one end to the left-side metal sheet M2 by a via v1 and is connected at its other end to the right-side metal sheet M2 by a via v1. Left side metal sheet M2 is connected to left side metal sheet M3 by a via v2 located at the opposite side of M2 as the via v1. Left side metal sheet M3 is connected to the left metal sheet M4 by a via v3, with the via v3 being located at the opposite side of M3 as the via v2. Right side metal sheet M2 is connected to right side metal sheet M3 by a via v2, and right side metal sheet M3 is connected to the right metal sheet M4 by a via v3.

The resulting resistance of the resistor Rs is:

$$Rs = R_{M1} + R_{M2} + R_{M3}$$

A desired number of such elementary resistor structures 43 and 41 are connected in parallel and in series to yield the desired resistance of R1 and RS.

The structure proposed in FIG. 18 is advantageous as it provides that similar elementary module is used for building the resistances Rs and R1 and it allows achievement of the best possible matching against temperature effects. However due to serialization of elements M1, M2, and M3 in Rs, the area for outing a low value Rs may be significantly higher than the previous Rs utilizing the topology of FIG. 17.

Figure 19:
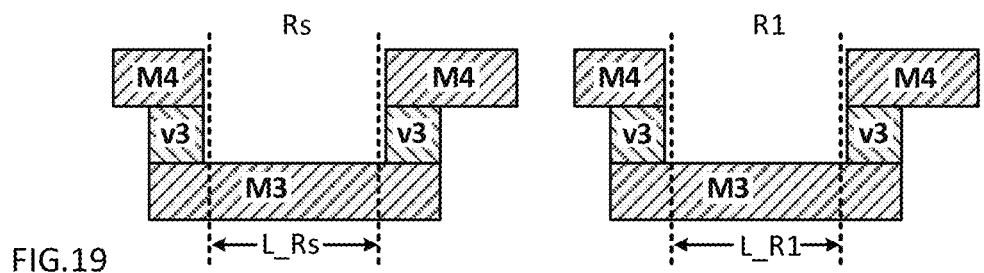
FIG. 19 is a cross sectional view of a third possible configuration for the elementary resistor units of R1 and Rs shown in FIG. 16 taken along the line Y-Y and Z-Z.
Figure 20:
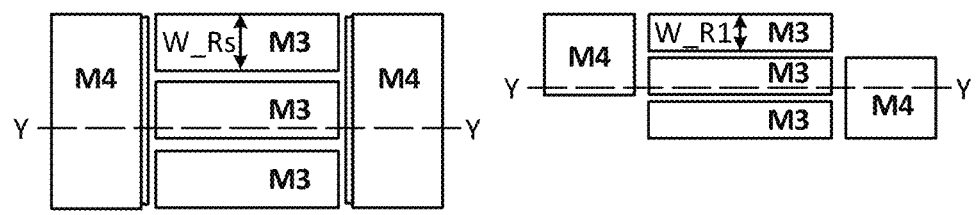
FIG. 20 is an enlarged top plan view showing on-silicon formation of the resistors R1 and Rs of the current sensor of FIG. 15 when utilizing the configuration of FIG. 19.

In a third possible implementation shown in the cross section of FIG. 19 (which is also a cross sectional view of the top plan view of FIG. 16 taken along lines Y-Y and Z-Z, and of the enlarged top plan view of FIG. 20 taken along line Y-Y), the metal layers M3 of the elementary resistor structures 41 and 43 forming Rs and R1 can have the same structure in terms of length and thickness, but with the width of the elementary resistor structures 43 forming R1 having a greater width than that of the elementary resistor structures R1 forming Rs, as may be observed in the enlarged top plan view of FIG. 20.

In the elementary resistor structure 41 forming Rs in this example, metal sheet M3 is connected at its ends to left and right metal sheets M4 by vias v3, and multiple such formed elementary resistor structures 41 are connected in parallel by the sharing of the metal sheets M4 by their metal sheets M3.

In the elementary resistor structure 43 forming R1 in this example, a given metal sheet M3 is connected at its ends to left and right metal sheets M4 by vias v3, and multiple such formed elementary resistor structures 43 are connected in series by sharing of certain ones of the metal sheets M4 by their metal sheets M3. For example, in the top plan view of R1 shown in FIG. 20, the central elementary resistor structure 43 shares its right side M4 with the M3 of bottom elementary resistor structure 43 and shares its left side M4 with the M3 of the top elementary resistor structure 43, forming a snake-shaped structure to connect the elementary resistor structures 43 in series.

This third implementation, like the first and second implementations, is quite useful, although it should be understood that the unequal widths may result in a slight gain error (which can be corrected for by trimming R2). Also understand that it is possible to use elementary resistor units 43 and 41 for both Rs and R1 having the same width, but with the number of such elementary resistor units 43 used for R1 being increased to therefore meet the desired resistance. It is to be noted that this third implementation has advantage of making it possible to use some relatively reasonable silicon area as Rs can be tuned to be a low value thanks to the larger W Rs, while a high resistance value can still be achieved with R1 thanks to a small W R1 and serialization. This structure allows a similar flow of the current as it uses one level of metal and the vertical stack up is exactly similar in Rs and R1, also offering a best possible matching against temperature effects. The flexibility to combine the advantages of the structures of FIG. 17 and FIG. 18 comes at the expense of the absolute systematic matching between Rs and R1 as highlighted above. However, this is a minor penalty to pay as the gain can be easily adjusted in production at chip level.

Figure 21:
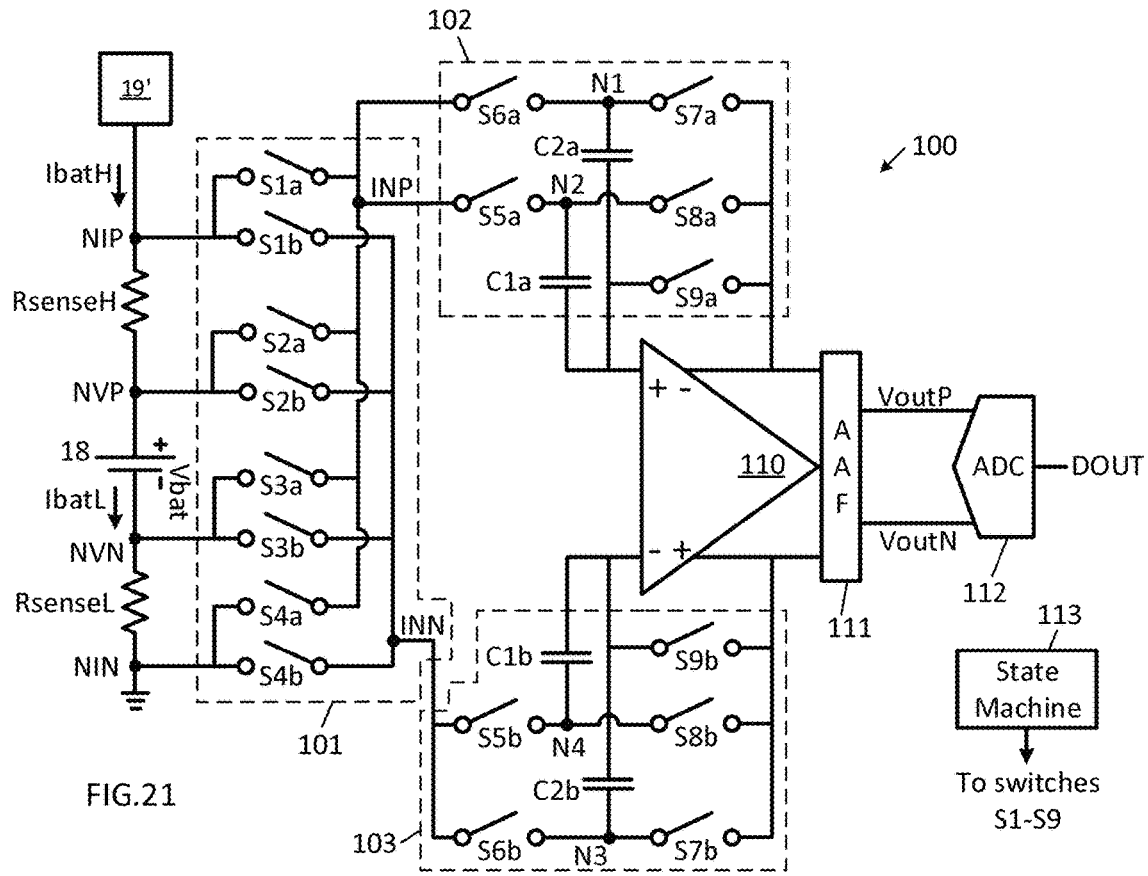
FIG. 21 is a schematic diagram of a configurable voltage/current sensor disclosed herein such as may be used to sense battery voltage, high-side battery current, and low-side battery current, and its connection to an overall wireless charging system.

Now described with reference to FIG. 21 is another embodiment of a voltage/current sensor for use in sensing load voltage and load current. Here, the load 18 is a battery that receives an input current from a power source 19' (which may be the power source 19' shown in FIG. 12, and in particular may be the output of the power converter 27, but may instead be the output of a rectifying bridge).

The battery 18 is coupled to the power source 19' through a high-side sense resistor RsenseH, and is coupled to ground through a low-side sense resistor RsenseL. The node between the power source and the high-sense resistor RsenseH is denoted as NIP, the node between the high-side sense resistor RsenseH and the battery 18 is denoted as NVP, the node between the battery 18 and the low-side sense resistor RsenseL is denoted as NVN, and the node between the low-side sense resistor RsenseL and ground is denoted as NIN.

An input multiplexer 101 has inputs connected to nodes NIP, NVP, NVN, and NIN, and outputs connected to nodes INP and INN. The input multiplexer 101 includes switch S1a connected between nodes NIP and INP, switch S2a connected between nodes NVP and INP, switch S3a connected between nodes NVN and INP, and switch S4a connected between nodes NIN and INN. The input multiplexer 101 also includes switch S1b connected between nodes NIP and INN, switch S2b connected between nodes NVP and INN, switch S3b connected between nodes NVN and INN, and switch S4b connected between nodes MN and INN.

A first programmable gain circuit 102 has an input connected to node INP, and outputs connected to the non-inverting input terminal of double-ended differential amplifier 110 and to the inverting output terminal of the double ended differential amplifier 110. The first programmable gain circuit 102 includes switch S6a connected between nodes INP and N1, switch S5a connected between nodes INP and N2, switch S7a connected between node N1 and the inverting output terminal of the differential amplifier 110, switch S8a connected between node N2 and the inverting output terminal of the differential amplifier 110, and switch S9a connected between the non-inverting input terminal and inverting output terminal of the differential amplifier 110. Capacitor C1a is connected between node N2 and the non-inverting input terminal of the differential amplifier 110, and capacitor C2a is connected between node N1 and the non-inverting input terminal of the differential amplifier 110.

A second programmable gain circuit 103 has an input connected to node INN, and outputs connected to the inverting input terminal of double-ended differential amplifier 110 and to the non-inverting output terminal of the double ended differential amplifier 110. The second programmable gain circuit 103 includes switch S6b connected between nodes INN and N3, switch S5b connected between nodes INN and N4, switch S7b connected between node N3 and the non-inverting output terminal of the differential amplifier 110, switch S8b connected between node N4 and the non-inverting output terminal of the differential amplifier 110, and switch S9b connected between the inverting input terminal and non-inverting output terminal of the differential amplifier 110. Capacitor C1b is connected between node N4 and the inverting input terminal of the differential amplifier 110, and capacitor C2b is connected between node N3 and the inverting input terminal of the differential amplifier 110.

An anti-aliasing filter 111 is connected to the inverting and non-inverting output terminals of the double-ended differential amplifier 110 and filters the signals therefrom to produce differential output voltages VoutP and VoutN, which are sampled by analog to digital converter 112 to produce a digital output DOUT that can be representative of the voltage Vbat across the battery 18, the high-side current IbatH into the battery 18, or the low-side current IbatL out of the battery 18 to ground, dependent upon mode. The digital output DOUT may be digital processed and read.

A state machine 113 controls the operation of the switches S1a-S9a, and S1b-S9b.

Figure 22A:
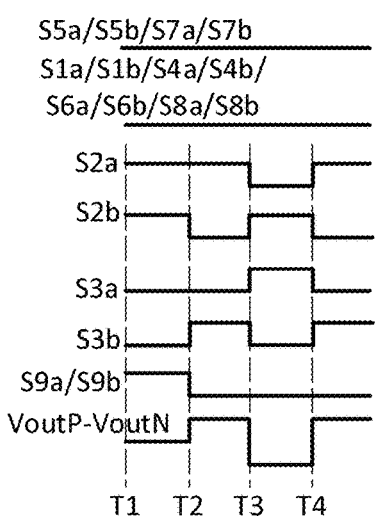
FIG. 22A is a timing diagram showing the switches and differential input voltage of the configurable voltage/current sensor of FIG. 21 when sensing battery voltage.

Operation of the voltage/current sensor to perform battery 18 voltage Vbat sensing is now described with additional reference to FIG. 22A. To perform battery voltage Vbat sensing, the state machine 113 closes switches S5a, S5b, S7a, and S7b, and opens switches S1a, S2b, S4a, S4b, S6a, S6b, S8a, and S8b.

At time T1, switches S2a, S2b, S9a, and S9b are closed, thereby connecting node NVP to the capacitor C1a as well as to capacitor C1b. Capacitors C1a and C1b have the same capacitance values, and therefore between times T1 and T2, the same input is applied to both input terminals of the differential amplifier 110, while the closing of switches S9a and S9b shorts the inputs of the differential amplifier 110 to the outputs of the differential amplifier 110, thereby performing an auto-zero operation. This auto-zeroing phase occurring between times T1 and T2 may last 10 μs, for example. Note that the auto-zeroing operation could instead have been performed by applying any two identical voltages to the inputs of the differential amplifier 110.

At time T2, switches S2b, S9a, and S9b open, while switch S3b closes, and switches S2a and S3a do not change state. This connects node NVP to the capacitor C1a, and connects node NVN to capacitor C1b. Therefore, here, capacitors C1a and C1b serve as the input capacitors, and the maintaining of the switches S7a and S7b as closed causes capacitors C2a and C2b to serve as the feedback capacitors. Measurement of the voltage Vbat across the battery 18, with a gain of C1a/C2a (or C1b/C2b, being that C1a and C1b have equal capacitances and C2a and C2b have equal capacitances). As an example, assuming that C2a has a value of 5 times that of C1a, the gain used by the differential amplifier 110 during battery voltage measurement is ⅕. As can be observed in FIG. 22A, the differential output VoutP-VoutN provided by the differential amplifier 110 rises from ground at time T1 to a value above one between times T2 and T3. This first measurement may last 20 μs, for example.

Chopping is then begun at time T3, in which switches S2b and S3a close and switches S2a and S3b open, while switches S9a and S9b do not change state. This connects node NVP to capacitor C1b and connects node NVN to capacitor C1a. This has the effect of inverting the differential output VoutP-VoutN a first time. Chopping continues at time T4, in which switches S2a and S3b close while switches S2b and S3a open, with the remainder of the switches not changing state. This returns the switches to the state they were between times T2 and T3, with the differential output VoutP-VoutN then being inverted once again.

The purpose of the chopping is to shift the signal in the frequency domain for ultimately rejecting amplifier's noise at de-chopping. These chopping phases may each last 20 μs, for example. Although two chopping phases are shown, additional chopping phases may be performed, such as to provide for one measurement phase and fifteen chopping phases, which collectively define one acquisition cycle. The acquisition cycle may be repeated for improving sensing accuracy, for example by digital averaging or filtering performed on the output DOUT of the ADC 112. De-chopping is also performed at this stage to reconstruct the value of the battery voltage Vbat in the digital domain.

Figure 22B:
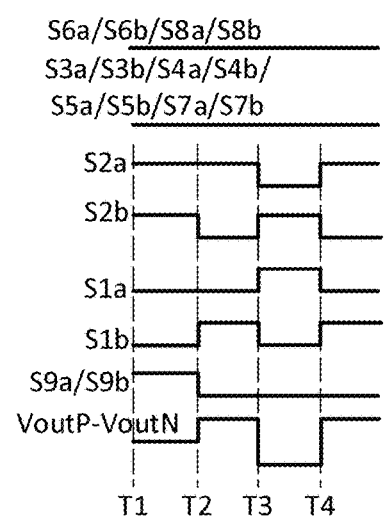
FIG. 22B is a timing diagram showing the switches and differential input voltage of the configurable voltage/current sensor of FIG. 21 when sensing high-side battery current.

Operation of the voltage/current sensor to perform high-side current IbatH sensing is now described with additional reference to FIG. 22B. To perform high-side current IbatH sensing, the state machine 113 closes switches S6a, S6b, S8a, and S8b, and opens switches S3a, S3b, S4a, S4b, S5a, S5b, S7a, and S7b.

At time T1, switches S2a, S2b, S9a, and S9b are closed, thereby connecting node NVP to the capacitor C2a as well as to capacitor C2b. Capacitors C2a and C2b have the same capacitance values, and therefore between times T1 and T2, the same input is applied to both input terminals of the differential amplifier 110, while the closing of switches S9a and S9b shorts the inputs of the differential amplifier 110 to the outputs of the differential amplifier 110, thereby performing an auto-zero operation. Note that the auto-zeroing operation could instead have been performed by applying any two identical voltages to the inputs of the differential amplifier 110.

At time T2, switches S2b, S9a, and S9b open, while switch S1b closes, and switches S2a and S1a do not change state. This connects the voltage at node NIP to capacitor C2b, and connects the voltage at node NVP to capacitor C2a. Therefore, the differential amplifier 110 at this phase is sensing the voltage drop across the high-side sense resistor RsenseH, which is representative of the high-side current IbatH. Here, the capacitors C2a and C2b serve as the input capacitors while the capacitors C1a and C1b serve as the feedback capacitors. Thus here, assuming that capacitors C2a, C2b have capacitance values that are five times that of capacitors C1a, C1b, the gain is 5.

Chopping is then begun at time T3, at which switches S2a and S1b open, while switches S2b and S1a close and the remainder of the switches maintain state. This connects the node NVP to the capacitor C2b and connects the node NIP to the capacitor C2a. This has the effect of inverting the differential output VoutP-VoutN a first time.

Chopping continues at time T4, in which switches S2b and S1a open while switches S2a and S1b close, with the remainder of the switches not changing state. This returns the switches to the state they were between times T2 and T3, with the differential output VoutP-VoutN then being inverted once again. Although two chopping phases are shown, additional chopping phases may be performed, such as to provide for one measurement phase and fifteen chopping phases, which collectively define one acquisition cycle. The acquisition cycle may be repeated for improving sensing accuracy, for example by digital averaging or filtering performed on the output DOUT of the ADC 112. De-chopping is performed to reconstruct the value of the high-side current IbatH in the digital domain.

Figure 22C:
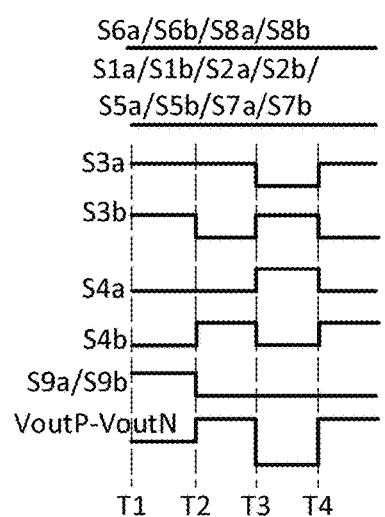
FIG. 22C is a timing diagram showing the switches and differential input voltage of the configurable voltage/current sensor of FIG. 21 when sensing low-side battery current.

Operation of the voltage/current sensor to perform low-side current IbatL sensing is now described with additional reference to FIG. 22C. To perform low-side current IbatL sensing, the state machine 113 closes switches S6a, S6b, S8a, and S8b, and opens switches S1a, S1b, S2a, S2b, S5a, S5b, S7a, and S7b.

At time T1, switches S3a, S3b, S9a, and S9b are closed, thereby connecting node NVN to the capacitor C2a as well as to capacitor C2b. Capacitors C2a and C2b have the same capacitance values, and therefore between times T1 and T2, the same input is applied to both input terminals of the differential amplifier 110, while the closing of switches S9a and S9b shorts the inputs of the differential amplifier 110 to the outputs of the differential amplifier 110, thereby performing an auto-zero operation. Note that the auto-zeroing operation could instead have been performed by applying any two identical voltages to the inputs of the differential amplifier 110.

At time T2, switches S3b, S9a, and S9b open, while switch S4b closes, and switches S3a and S4a do not change state. This connects the voltage at node MN to capacitor C2b, and connects the voltage at node NVN to capacitor C2a. Therefore, the differential amplifier 110 at this phase is sensing the voltage drop across the low-side sense resistor RsenseL, which is representative of the low-side current IbatL. Here, the capacitors C2a and C2b serve as the input capacitors while the capacitors C1a and C1b serve as the feedback capacitors. Thus here, assuming that capacitors C2a, C2b have capacitance values that are five times that of capacitors C1a, C1b, the gain is 5.

Chopping is then begun at time T3, at which switches S3a and S4b open, while switches S3b and S4a close and the remainder of the switches maintain state. This connects the node NVN to the capacitor C2b and connects the node MN to the capacitor C2a. This has the effect of inverting the differential output VoutP-VoutN a first time. Chopping continues at time T4, in which switches S3b and S4a open while switches S3a and S4b close, with the remainder of the switches not changing state. This returns the switches to the state they were between times T2 and T3, with the differential output VoutP-VoutN then being inverted once again. Although two chopping phases are shown, additional chopping phases may be performed, such as to provide for one measurement phase and fifteen chopping phases, which collectively define one acquisition cycle. The acquisition cycle may be repeated for improving sensing accuracy, for example by digital averaging or filtering performed on the output DOUT of the ADC 112. De-chopping is performed to reconstruct the value of the low-side current IbatL in the digital domain.

As can be observed from the above description of the above battery voltage Vbat, high-side current IbatH, and low-side current IbatL measurement modes, which capacitor C1a, C1b or C2a, C2b is used as the input capacitor which capacitor C1a, C1b or C2a, C2b is used as the feedback capacitor can be selected. Therefore, through the operation of the programmable gain circuits 102 and 103, the gain for any given sensing phase can be selected.

Figure 23:
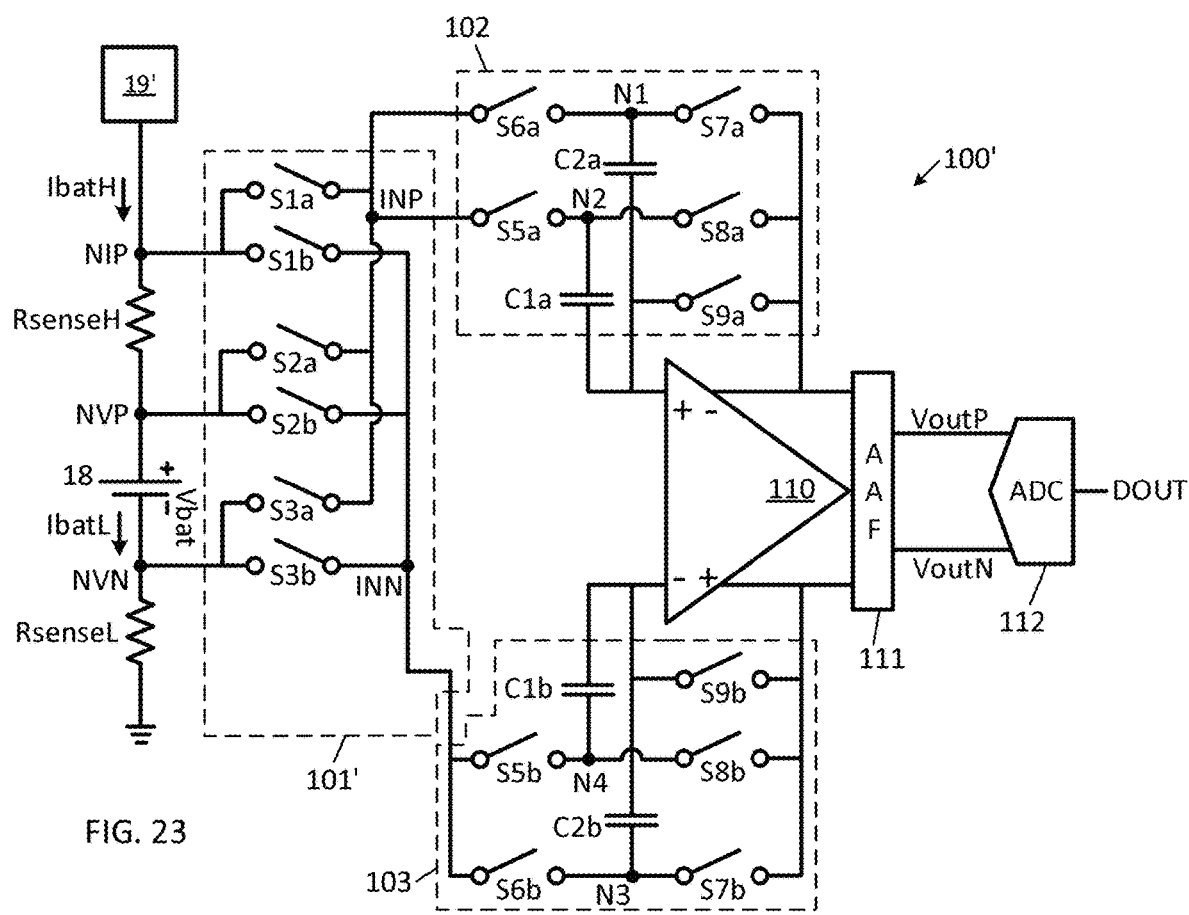
FIG. 23 is a schematic diagram of a second embodiment of a configurable voltage/current sensor disclosed herein such as may be used to sense battery voltage, high-side battery current, and low-side battery current, and its connection to an overall wireless charging system.

In some applications, low-side current IbatL sensing may not be desired. In such cases, such as that shown in FIG. 23, the input multiplexer 101' is modified to remove the switched S4a and S4b. Otherwise, the voltage/current sensor 100' of FIG. 23 remains the same as that of FIG. 21.

Figure 24:
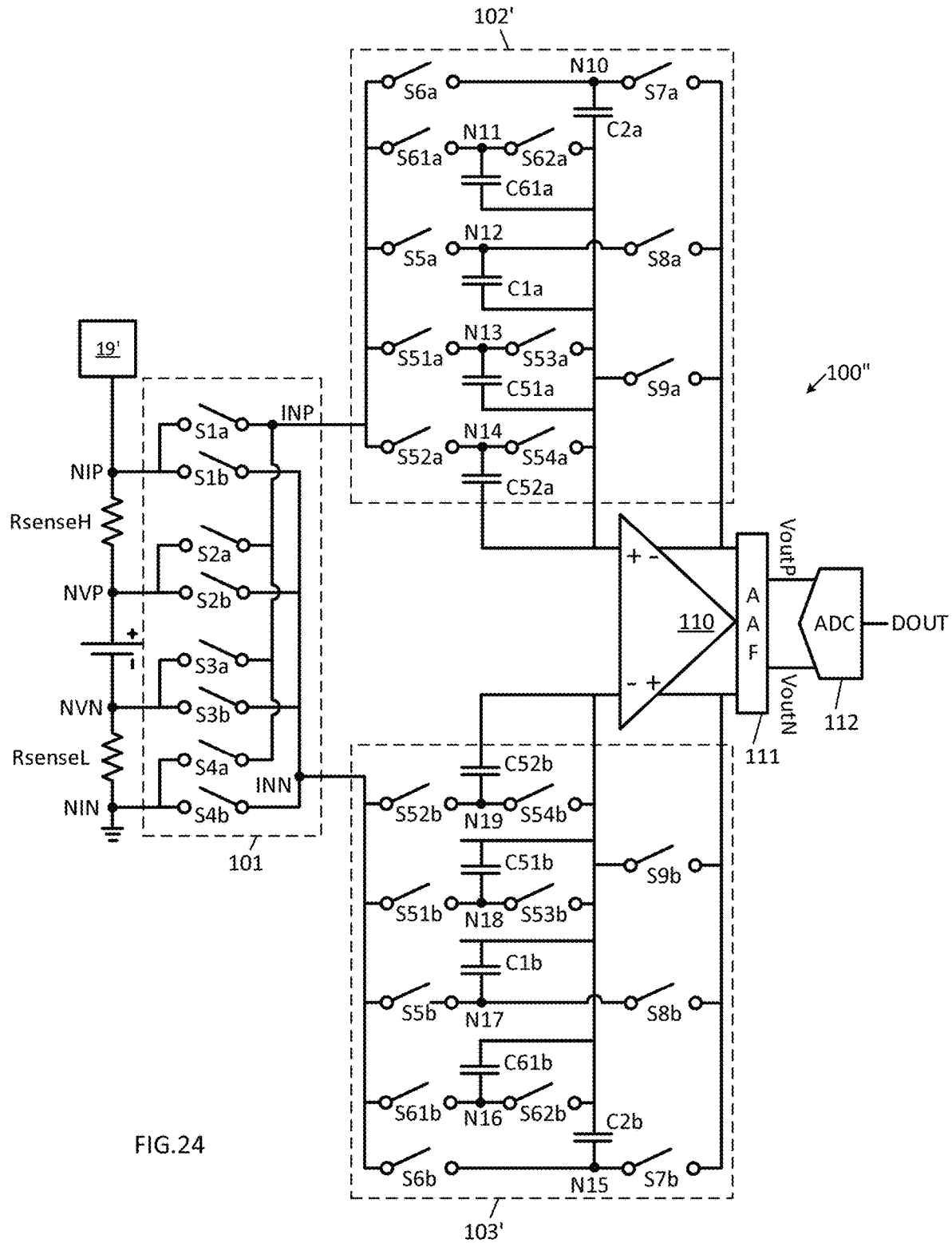
FIG. 24 is a schematic diagram of a third embodiment of a configurable voltage/current sensor disclosed herein such as may be used to sense battery voltage, high-side battery current, and low-side battery current, and its connection to an overall wireless charging system.

Now described with reference to FIG. 24 is an embodiment of a voltage/current sensor 100" permitting for a wider range of programmable gains. Here, as compared to the voltage/current sensor 100" of FIG. 21, the power source 19', input multiplexer 101, and double-ended differential amplifier remain the same, but the first programmable gain circuit 102' and second programmable gain circuit 103' are modified.

The first programmable gain circuit 102' has an input connected to node INP, and outputs connected to the non-inverting input terminal of double-ended differential amplifier 110 and to the inverting output terminal of the double ended differential amplifier 110. The first programmable gain circuit 102' includes switch S6a connected between nodes INP and N10, switch S7a connected between node N10 and the inverting output terminal of differential amplifier 110, switch S61a connected between nodes INP and N11, switch S62a connected between node N11 and the non-inverting input terminal of differential amplifier 110, switch S5a connected between nodes INP and N12, switch S8a connected between node N12 and the inverting output terminal of differential amplifier 110, switch S51a connected between nodes INP and N13, switch S53a connected between nodes N13 and the non-inverting input terminal of differential amplifier 110, switch S9a connected between the non-inverting input terminal of differential amplifier 110 and the inverting output terminal of differential amplifier 110, switch S52a connected between nodes INP and N14, and switch S54a connected between node N14 and the non-inverting input terminal of the differential amplifier 110.

The second programmable gain circuit 103' has an input connected to node INN, and outputs connected to the inverting input terminal of double-ended differential amplifier 110 and to the non-inverting output terminal of the double ended differential amplifier 110. The second programmable gain circuit 103' includes switch S6b connected between nodes INN and N15, switch S7b connected between node N15 and the non-inverting output terminal of differential amplifier 110, switch S61b connected between nodes INN and N16, switch S62b connected between node N16 and the inverting input terminal of differential amplifier 110, switch S5b connected between nodes INN and N17, switch S8b connected between node N17 and the non-inverting output terminal of differential amplifier 110, switch S51b connected between nodes INN and N18, switch S53b connected between nodes N18 and the inverting input terminal of differential amplifier 110, switch S9b connected between the inverting input terminal of differential amplifier 110 and the non-inverting output terminal of differential amplifier 110, switch S52b connected between nodes INN and N19, and switch S54b connected between node N19 and the inverting input terminal of the differential amplifier 110.

Capacitor C2a is connected between node N10 and the non-inverting input terminal of the differential amplifier 110, capacitor C61a is connected between node N11 and the non-inverting input terminal of the differential amplifier 110, capacitor C1a is connected between node N12 and the non-inverting input terminal of the differential amplifier 110, capacitor C51a is connected between node N13 and the non-inverting input terminal of the differential amplifier 110, and capacitor C52a is connected between node N14 and the non-inverting input terminal of the differential amplifier 110.

Capacitor C2b is connected between node N15 and the inverting input terminal of the differential amplifier 110, capacitor C61b is connected between node N16 and the inverting input terminal of the differential amplifier 110, capacitor C1b is connected between node N17 and the inverting input terminal of the differential amplifier 110, capacitor C51b is connected between node N18 and the inverting input terminal of the differential amplifier 110, and capacitor C52b is connected between node N19 and the inverting input terminal of the differential amplifier 110.

Operation proceeds the same as described above with respect to FIG. 24, except here the programmable gain circuits 102' and 103' permit selection from among capacitors C2a, C2b, C61a, C61b, C1a, C1b, C51a, C51b, C52a, C52b as the input capacitors and feedback capacitors. Here, capacitors C2a and C61a may have capacitance values that are five times that of capacitor C1a, capacitor C51a may have a capacitance value that is 0.5 that of capacitor C1a, and capacitor C52a may have a capacitance value that is 0.25 that of capacitor C1a. Similarly, capacitors C2b and C61b may have capacitance values that are five times that of capacitor C1b, capacitor C51b may have a capacitance value that is 0.5 that of capacitor C1b, and capacitor C52b may have a capacitance value that is 0.25 that of capacitor C1b. Thus, here, gain can range from 1/40 (with capacitors C52a and C52b serving as the input capacitors and capacitors C2a/C61a and C2b/C61b connected in parallel and serving as the feedback capacitors) to 40 (with capacitors C2a/C61a and C2b/C61b connected in parallel and serving as the input capacitors, and capacitors C52a and C52b serving as the feedback capacitors).

The voltage/current sensors 100, 100', and 100" described herein with programmable gains have a variety of advantages. They utilize input capacitors, thereby blocking offset DC currents. Moreover, the capacitors utilized may be MOM (metal-oxide-metal) capacitors, providing resistance to piezoelectric effects caused by mechanical stressed. Still further, the use of auto-zeroing and chopping serve to cancel noise and residual offset effects, and provide insensitivity to the common-mode of the measured signal.

Figure 25:
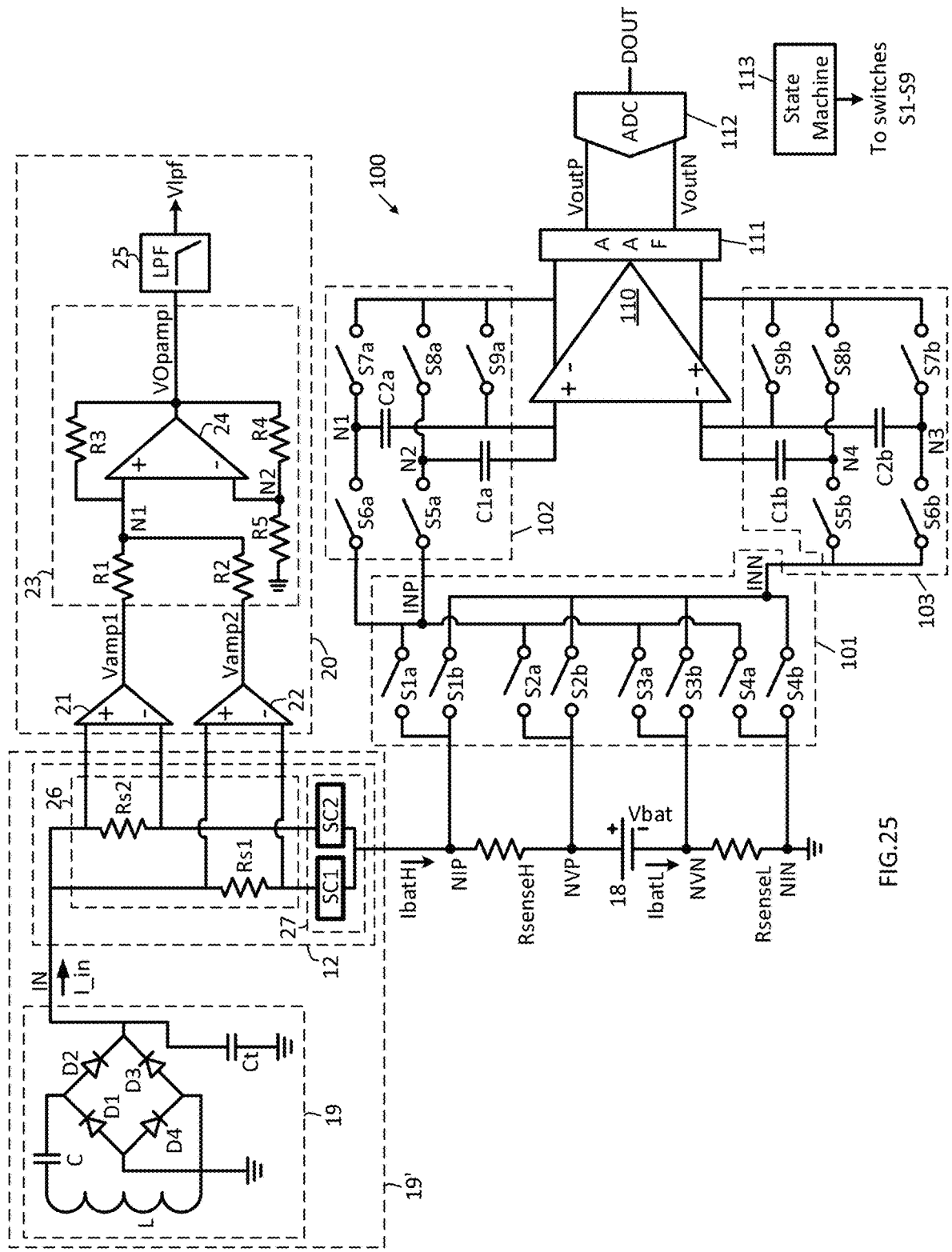
FIG. 25 is a schematic diagram of a configurable voltage/current sensor disclosed herein similar to that of FIG. 1 such as may be used to sense battery voltage, high-side battery current, and low-side battery current, and its connection to an overall wireless charging system that also performs power source current sensing.

Finally, it is clear that modifications and variations may be made to what has been described and illustrated herein, without thereby departing from the scope of this disclosure, as defined in the annexed claims. For example, shown in FIG. 25 is an embodiment of the sensor 100 utilizing the power source 19' of FIG. 21, as well as the remainder of the circuitry of FIG. 21 to provide for sensing of the current immediately after the rectifying bridge 19 as well as the battery voltage/current sensing described above.

Further designs and layouts for the sense resistor Rs such as may be used in the current sensors disclosed herein are now described.

Figure 26A:
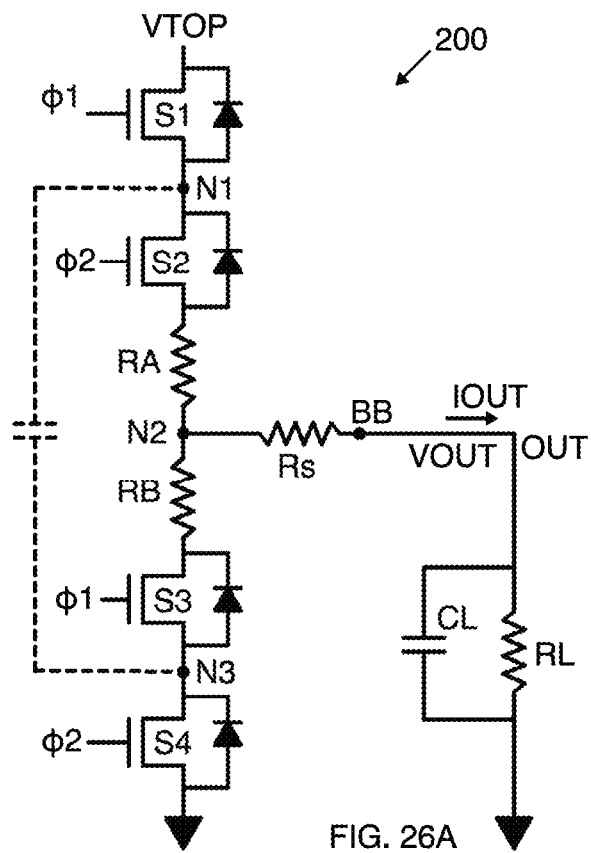
FIG. 26A is a schematic block diagram of a switching converter described herein, including discrete resistors RA, RB, and Rs for sensing the output current.

However, first, consider the converter 200 of FIG. 26A. The converter 200 includes: an n-channel transistor S1 having its drain connected to node VTOP, its source connected to node N1, and its gate coupled to control signal φ1; and an n-channel transistor S2 having its drain connected to node N1, its source connected to resistor RA, and its gate coupled to control signal φ2. Resistor RA is connected between the source of transistor S1 and node N2, and resistor RB is connected between node N2 and the drain of transistor S3. N-channel transistor S3 has its drain connected to resistor RB, its source connected to node N3, and its gate coupled to the control signal φ1. N-channel transistor S4 has its drain connected to the source of transistor S3, its source connected to ground, and its gate coupled to the control signal φ2. Resistance Rs (which may be a parasitic resistance) is connected between node N2 and an output bump BB. The load (represented by load resistance RL and load capacitance CL connected in parallel) is connected to the output bump BB. The bump itself may be resistive, which is not represented in FIG. 26A.

In this design, it may be desired to evaluate the output current IOUT sourced to the load CL/RL. This evaluation may be performed through performing measurements of the voltage across resistor RA during high-side conduction and/or performing measurements of the voltage across resistor RB during low-side conduction. As an alternative, this evaluation may be performed by performing measurements of the voltage across the resistance Rs during high-side conduction, low-side conduction, or both. As another alternative, resistors RA and RB may not be present and the evaluation is performed by performing measurements of the voltage across the resistance Rs during high-side conduction, low-side conduction, or both, as shown in FIG. 26B.

Figure 27:
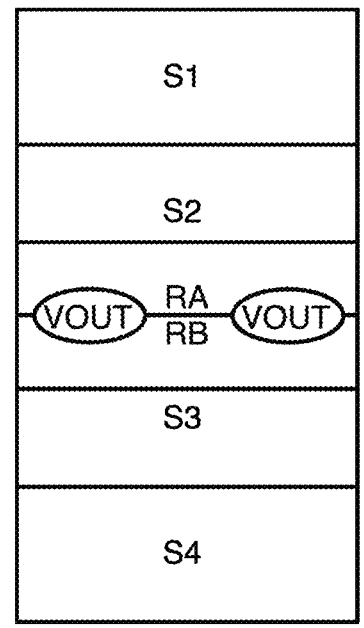
FIG. 27 is a diagram illustrating controlled current sensing performed on the switching converter of FIG. 26A using resistors RA and RB.

A concern in evaluation of the output current IOUT based on measuring the voltages across resistors RA and RB is that for being well "controlled" ("controlled" being used here to qualify an element having a deterministic value at mass production), such resistors are formed using actual physical planar resistances inserted in series with source of S2 and drain of S3, and not relying on not a well "controlled" parasitic resistance. Therefore, RA and RB may consume an undesirable amount of area. See FIG. 27, showing the area occupied by transistors S1-S4, and the area occupied by planar resistances RA and RB. Sensing is performed across planar resistance RA or RB, depending on whether high-side or low-side conduction of the converter is occurring. Since these resistances RA and RB are integrated planar elements and their performance across temperature can be predicted based upon the layout and nature of materials, the sensing can be considered to be "controlled".

Figure 26B:
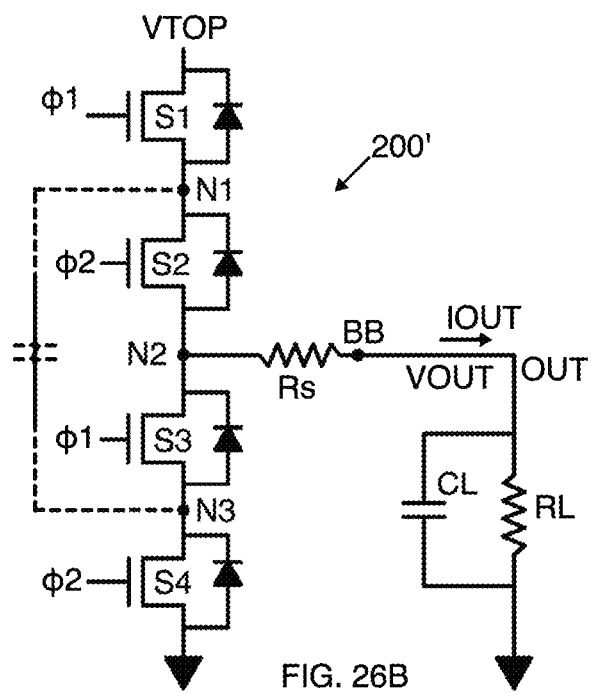
FIG. 26B is a schematic block diagram of a switching converter described herein, including discrete resistor Rs for sensing the output current.
Figure 28:
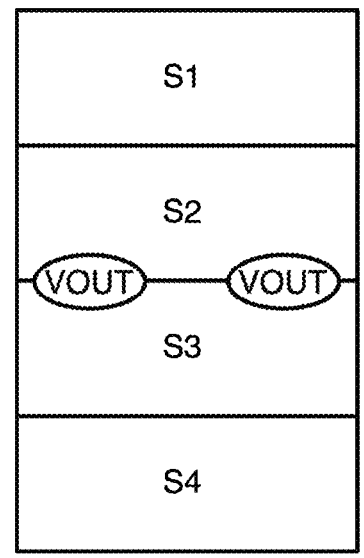
FIG. 28 is a diagram illustrating uncontrolled current sensing performed on the switching converter of FIG. 26B using resistor Rs.

We refer now to the case where one would prefer not to use RA and/or RB, but rather rely on Rs, as shown in FIG. 26B. The concern in evaluation of the output current IOUT based on resistor Rs is perhaps best understood with reference to FIG. 28. Here, voltage sensing is performed across the parasitic resistive path represented by resistance Rs. Given that the source of S2 is directly connected to the drain of S3 and that the common node N2 is connected to the output bump, and the parasitic nature of this resistance Rs from the common point (node N2) to the output bump BB, this sensing is "uncontrolled", and performance across temperature may unpredictable due to assembly variation.

Figure 29:
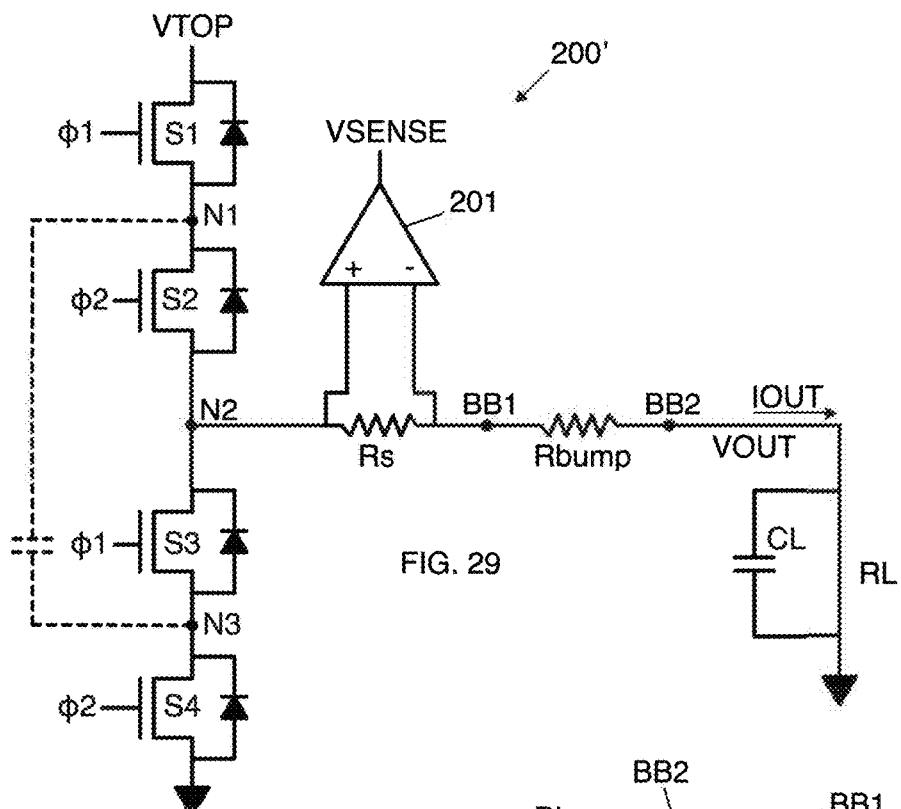
FIG. 29 is a schematic block diagram of a switching converter described herein, including a resistance Rs formed by the conductive path from node N2 to output bump BB used for sensing the output current.

Therefore, an improvement to the design of the converter 200' is now described with reference to FIG. 29.

The converter 200' includes: an n-channel transistor S1 having its drain connected to node VTOP, its source connected to node N1, and its gate coupled to control signal φ1; and an n-channel transistor S2 having its drain connected to node N1, its source connected to node N2, and its gate coupled to control signal φ2. N-channel transistor S3 has it drain connected to node N2, its source connected to node N3, and its gate coupled to the control signal φ1. N-channel transistor S4 has its drain connected to the source of transistor S3, its source connected to ground, and its gate coupled to the control signal φ2. Here, the resistance shown as Rs represents the parasitic resistance formed by the conductive path between node N2 and the "lower" part BB1 of the output bump BB (referring to FIG. 30). The load (represented by load resistance RL and load capacitance CL connected in parallel) is connected to the "upper" part BB2 of the output bump BB (referring to FIG. 30). The parasitic resistance of the bump is labelled as Rbump and represents the actual electrical path from the "lower" part BB1 of the bump BB to the "upper" part BB2 of the bump BB. The parasitic resistance Rbump of the bump is not used as part of the sensing path.

The output current IOUT flows from node N2, through resistance Rs, to the output "lower" part BB1 of bump BB. Sense amplifier 201 has its non-inverting input terminal coupled to node N2 and has its inverting input terminal coupled to BB1, and, based upon these inputs, generates a sense voltage VSENSE that is indicative of the current IOUT flowing through the resistance Rs.

Figure 30:
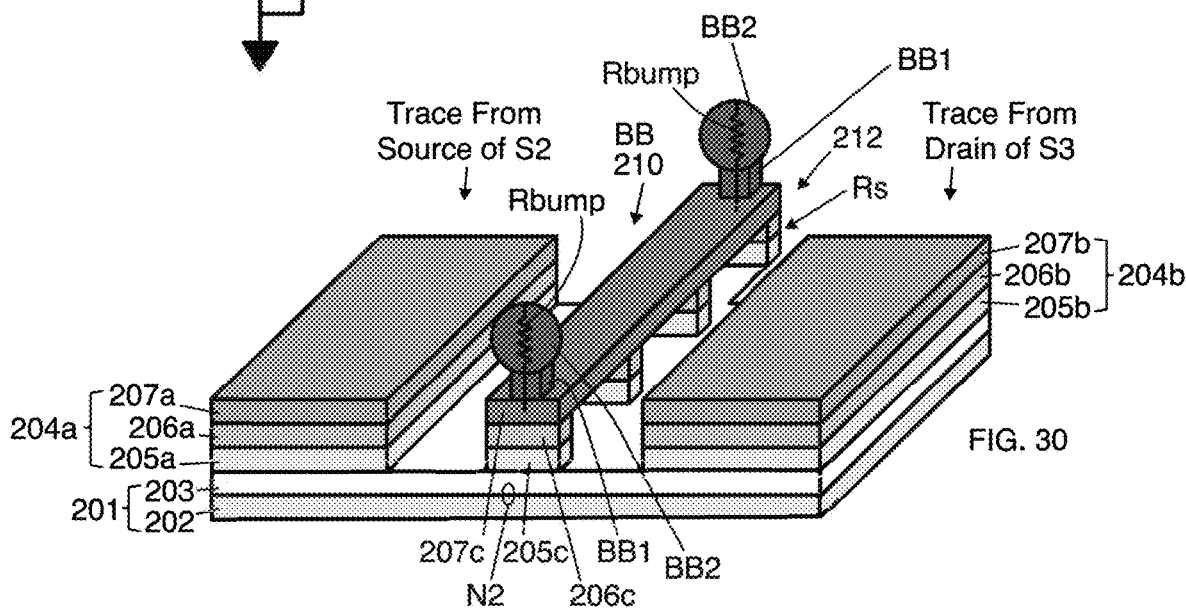
FIG. 30 is a diagrammatical perspective view of the layout of the conductive path of FIG. 29 from node N2 to output bump BB.
Figure 31:
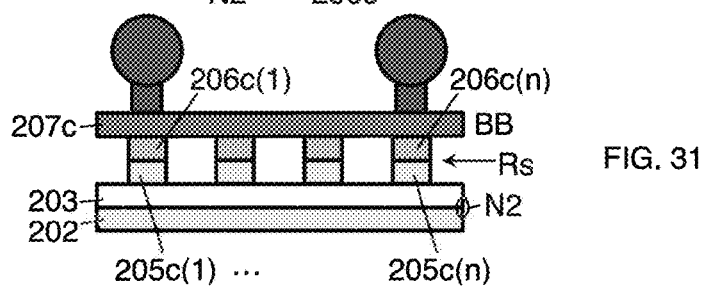
FIG. 31 is a diagrammatical side view of the layout of the conductive path of FIG. 29 from node N2 to output bump BB.
Figure 32:
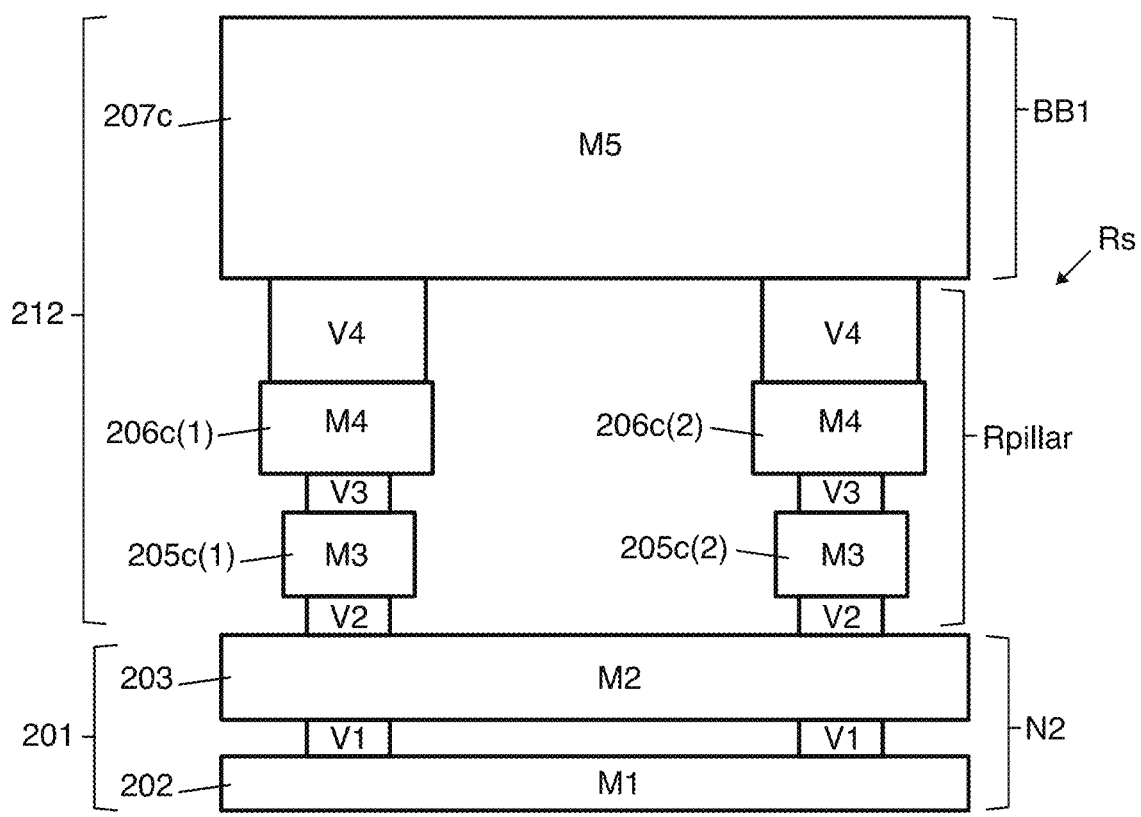
FIG. 32 is a cross sectional view of two conductive pillars of the conductive path of FIG. 29, in an embodiment in which the conductive pillars are connected in parallel.

Now described with reference to FIGS. 30-32 is the resistance Rs, which, as stated above, is the conductive path in an interconnection region between node N2 and the "lower" part BB1 of the output bump BB. In particular, shown in FIG. 30 are traces from (or appropriate source/drain areas of) transistors S2 and S3 and the conductive path between node N2 and the "lower" part BB1 of output bump BB. As shown, the conductive path from the source of transistor S2 to the drain of transistor S3 is formed by an unbroken conductive stack 201 extending in an unbroken fashion from the source of transistor S2 toward BB1 and from BB1 toward the drain of transistor S3. A first portion 204a of a broken conductive stack 204 extends from the source of transistor S2 toward (but not reaching) BB1, and a second portion 204b of the broken conductive stack 204 extending from the drain of transistor S3 toward (but not reaching) BB1, separated by a break 210.

The broken conductive stack portions 204a, 204b are stacked on and carried by unbroken conductive stack 201, and, as stated, are separated by break 210.

The unbroken conductive stack 201 is formed by metal sheet 202 in a first metal layer M1, the first metal layer M1 forming a bottommost layer. The unbroken conductive stack 201 includes a metal sheet 203 in a second metal layer M2 overlying and in electrical contact with the metal sheet 202 in the first metal layer M1, with the electrical contact being made by a first via layer V1.

The broken conductive stack portion 204a is formed by: a metal sheet 205a in a third metal layer M3 overlying and in electrical contact with the metal sheet 203 in the second metal layer M2, with the electrical contact being made by a second via layer V2; a metal sheet 206a in a fourth metal layer M4 overlying and in electrical contact with the metal sheet 205a in the third metal layer M3, with the electrical contact being made by a third via layer V3; and a metal sheet 207a in a fifth metal layer M5 overlying and in electrical contact with the metal sheet 206a in the fourth metal layer M4, with the electrical contact being made by a fourth via layer V4.

The broken conductive stack portion 204b is formed by: a third metal sheet 205b in the third metal layer M3 overlying and in electrical contact with the second metal sheet 203 in the second metal layer M2, with the electrical contact being made by the second via layer V2; a fourth metal sheet 206b in the fourth metal layer M4 overlying and in electrical contact with the third metal sheet 205b in the third metal layer M3, with the electrical contact being made by the third via layer V3; and a fifth metal sheet 207b in the fifth metal layer M5 overlying and in electrical contact with the fourth metal sheet 206b in the fourth metal layer M4, with the electrical contact being made by the fourth via layer V4.

The midpoint in the break 210 between the broken conductive stack portions 204a, 204b, and right at the center of the conductive stack 201, can be considered to be the node N2. Positioned at this midpoint in the break 210 and extending to the "lower" part of output bump BB1 is a central conductive stack portion 212. The central conductive stack portion 212 is stacked on and carried by a portion of the unbroken conductive stack 201 extending from node N2 to BB1.

The central conductive stack portion 212 includes a third metal layer M3 overlying and in electrical contact with the metal sheet 203 in the break 210, with the electrical contact being made by a second via layer V2. The third metal layer M3 in the central conductive stack portion includes n separate metal sheets, denoted as 205c(1), . . . , 205c(n).

The central conductive stack portion 212 further includes a fourth metal layer M4 overlying and in electrical contact with the third metal layer M3, with the electrical contact being made by a third via layer V3. The fourth metal layer M4 in the central conductive stack portion 212 is broken into n separate metal sheets, denoted as 206c(1), . . . , 206c(n).

The central conductive stack portion 212 also includes a fifth metal layer M5 overlying and in electrical contact with the fourth metal layer M4, with the electrical contact being made by a fourth via layer V4. The fifth metal layer M5 in the central conductive stack portion 212 is formed by an unbroken metal sheet 207c.

Due to the broken conductive stack portions 204a, 204b, current that arrives at node N2 from either transistor S2 or transistor S3 is flowing only in the first metal layer M1 and second metal layer M2. Stated another way, current flowing through metal layers M3, M4, and M5 in the broken conductive stack portions 204a, 204b flows down into the metal layers M2 and M1 prior to reaching node N2. Current flow from node N2 flows through the metal layers M1, M2 and the various metal layers M3, M4, M5 of the central conductive stack portion 212 and up through the metal sheet 207c into the "lower" part BB1 of the output bump BB.

The sheets of first and second metal layers M1, M2, and M5 are designed to be substantially lower in resistance than the sheets of the metal layers M3 and M4. Thus, the resistance of the sheets of the metal layers M1, M2, and M5 can be substantially neglected, and the metal sheets 205c(1), . . . , 205c(n) and 206c(1), . . . , 206c(n) of the metal layers M3 and M4 in the central conductive stack portion 212 can be considered to form resistive pillars, together with the electrical contact V2 from M2 to M3, and the electrical contact V3 from M3 to M4, and the electrical contact V4 from M4 to M5. It is the resistance provided by these resistive pillars that provides the resistance of the conductive path between node N2 and the "lower" part BB1 of output bump BB. By carefully selecting the material forming the metal sheets 205c(1), . . . , 205c(n) and 206c(1), . . . , 206c(n) and by carefully selecting the dimensions and geometry of the metal sheets 205c(1), . . . , 205c(n) and 206c(1), . . . , 206c(n), the resistance of the conductive path between node N2 and "lower" part BB1 of output bump BB can therefore be carefully selected.

There may be approximately 1000 such resistive pillars along the conductive path between node N2 and "lower" part BB1 of output bump BB, with each resistive pillar having a resistance of approximately 4Ω.

In the example shown in FIGS. 30-32, the resistive pillars are electrically connected in parallel so that an overall resistance Rs (or Rsense referring to FIG. 14) of 4 mΩ(4 Ω/1000) is achieved. It should be appreciated that instead, the resistive pillars may be electrically connected in series so that an overall resistance R1 (referring to FIG. 14) of 4 kΩ (4 Ω*1000) is achieved.

Figure 33:
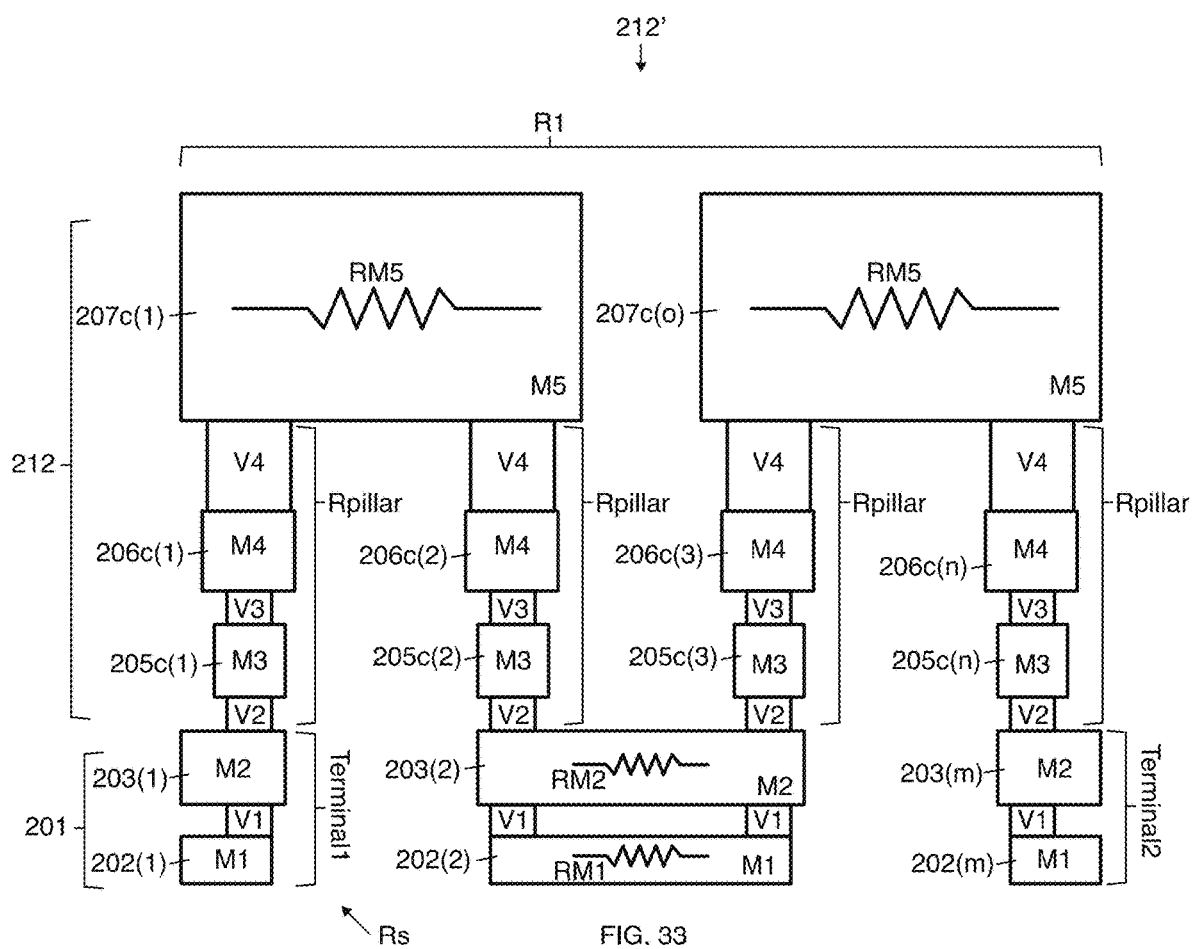
FIG. 33 is a cross sectional view of two conductive pillars of the conductive path of FIG. 29, in an embodiment in which the conductive pillars are connected in series.

This alternative series version of the design is shown in FIG. 33. Here, metal layer M1 is also broken into separate metal sheets $202(1), \ldots, 202(m)$ spaced apart from one another and each having a resistance of RM1, and metal layer M2 is likewise also broken into separate metal sheets $203(1), \ldots, 203(m)$ spaced apart from one another and having a resistance of RM2. The resistances RM1 and RM2 are each on the order of milliohms (e.g., 3 mΩ). Metal layer M5 is likewise broken into separate metal sheets $207c(1), \ldots, 207c(o)$, each having a resistance of RM5 on the order of milliohms (e.g., 3 mΩ), while the resistance Rpillar of each pillar formed by metal sheets $205c(1), \ldots, 201c(n)$ and $206c(1), \ldots, 206c(n)$ is on the order of ohms (e.g., 3Ω).

Therefore, current flow is into terminal 1 formed of metal sheet $202(1)$ of metal layer M1 and metal sheet $203(1)$ of metal layer M2, up through metal sheet $205c(1)$ of metal layer M3 and metal sheet $206c(1)$ of metal layer M4 into metal sheet $207c(1)$ of metal layer M5, down through metal sheet $206c(2)$ of metal layer M4 and metal sheet $205c(2)$ of metal layer M3 into metal sheets $203(2), 202(2)$ of metal layers M2, M1. This completes current traversal through one resistive pillar. Current flow continues into metal layers M1, M2 of the next resistive pillar and through this resistive pillar in the same fashion as described above until the current flows up and out of the Terminal 2. Seen between Terminal 1 and Terminal 2, and assuming that that metal layers M1/M2/M5 are large enough for their sheet resistance to be negligible compared to the resistance of the pillar formed by the stack of V2/M3/V3/M4/V4, the resistance R1 of FIG. 33 is equivalent to m*Rpillar. Likewise, the resistance of FIG. 32 when repeated for n pillars is equivalent to Rpillar/n.

By using combination of series and parallel arrangement one can therefore produce a ratiometric R1/Rsense for providing process and temperature independent amplification factor, used in current sensor circuitry as per FIG. 14.

It should be appreciated that process design rules and constraints may be that the metal sheets of the metal layers M3, M4 must be greater than a certain size. Therefore, the structures of the central conductive stack portions 212, 212' shown in FIGS. 30-33 may not be able to be formed if the size thereof is to be outside of the process design rules and constraints. In this instance, alternative designs may be used.

Figure 34:
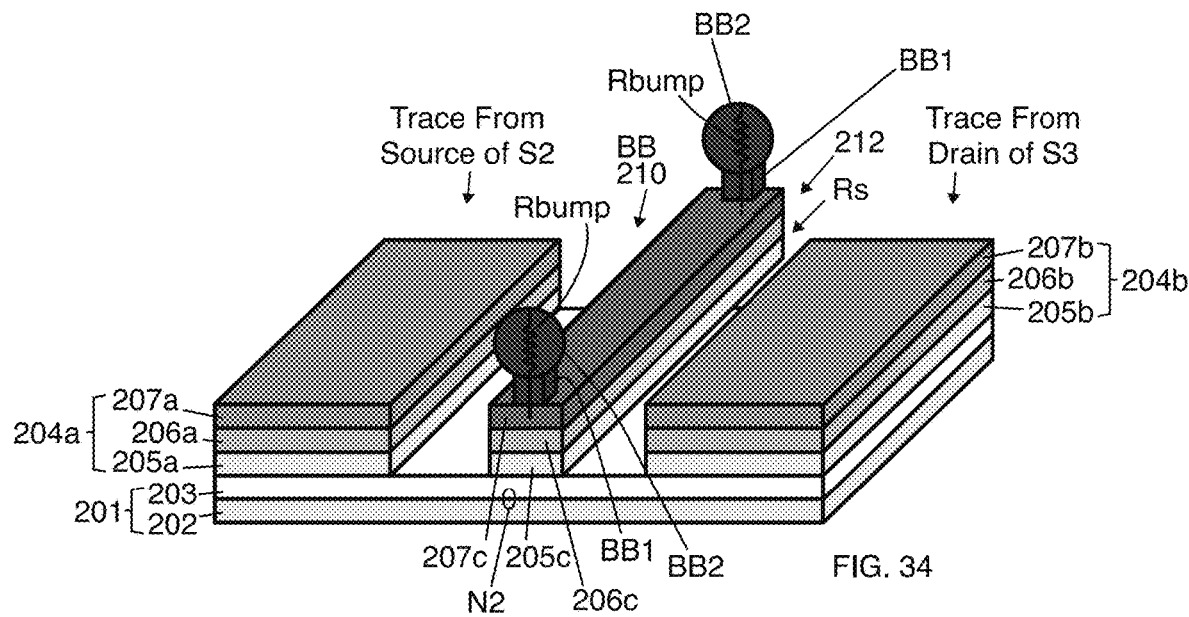
FIG. 34 is a diagrammatical perspective view of an alternative layout for the conductive path of FIG. 29 from node N2 to output bump BB.
Figure 35:
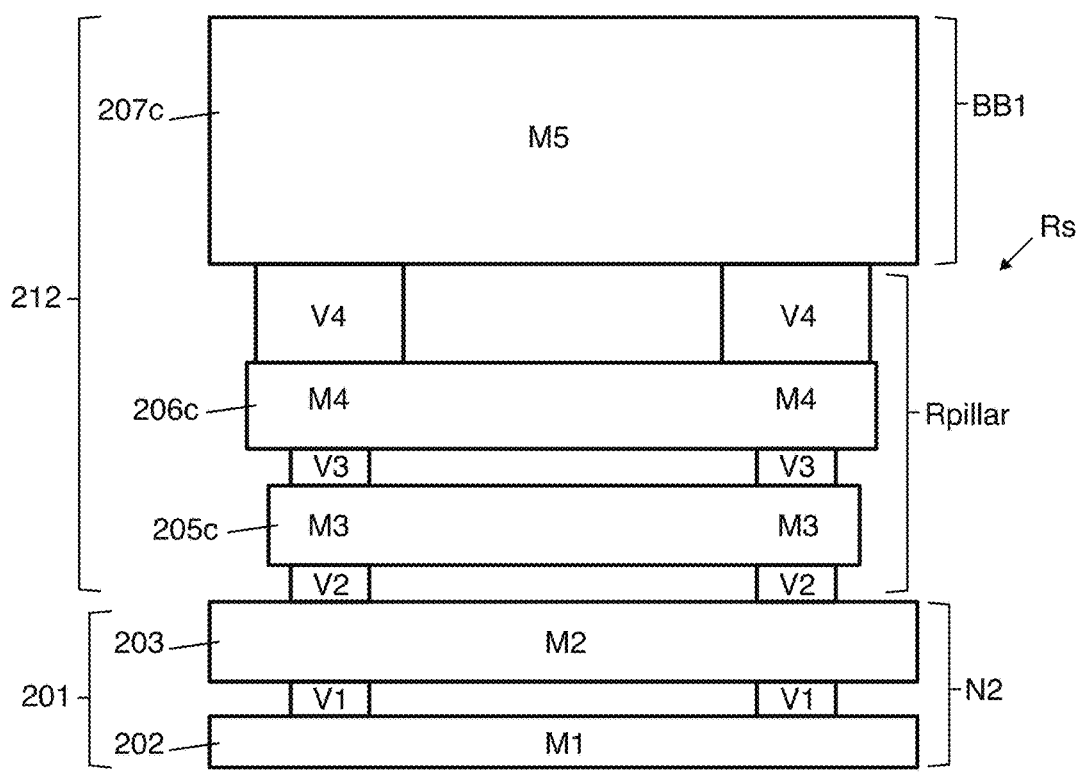
FIG. 35 is a cross sectional view of two conductive pillars of the conductive path of FIG. 34, in an embodiment in which the conductive pillars are connected in parallel.

In the design shown in FIGS. 34-35, the metal layers M3 and M4 of the central stack portion 212 are unbroken. Thus: third metal layer M3 is formed by metal sheet $205c$ extending from node N2 to lower part BB1 of output bump BB, overlying the metal sheet 203 of second metal layer M2 and being electrically connected thereto by via layer V2; and fourth metal later M4 is formed by metal sheet $206c$ extending from node N2 to lower part BB1 of output bump BB, overlying the metal sheet $205c$ of third metal layer M3 and being electrically connected thereto by via layer V3. Due to the break 210 between the broken conductive stack portions 204a, 204b, current is flowing upward from the first and second metal layers M1, M2. Indeed, since the vias of the via layers V2 and V3 physically separate the metal layers M2, M3, and M4, the current flow is from the first and second metal layers M1, M2 upward to the fifth metal layer M5 and not horizontal. Therefore, the effective resistance of the resistive pillars remains the same in the design of FIGS. 34-35 as in FIGS. 30-33.

Due to the specific design of the conductive path between the source of transistor S2 and drain of transistor S3 with the break 210 between the broken conductive stack portions 204a, 204b, current flow from node N2 to lower part BB1 of output bump BB is constrained to be through the central conductive stack portion 212 which includes the resistive pillars described above connected in parallel to create the resistance used for current sensing. Since the construction and geometry of the resistive pillars is carefully controlled, the sensing is therefore controlled. Thus, the designs disclosed herein provide for controlled sensing of the current output by the converter 200' to the load RL, CL, utilizing the conductive path between node N2 and the lower part BB1 of output bump BB to thereby save area as a specific planar resistor that would otherwise be used is eliminated.

Although the use of a break 210 in the conductive path from node N2 to lower part BB1 of output bump BB and the addition of the central conductive stack portion 212 is described above in the context of the converter 200', understand that this design may be used in any conductive path to create a sense resistor Rs used in current or voltage sensing. Thus, this design for Rs may be used as to create a resistor used for sensing in any of the circuits described above with reference to FIGS. 9, 12, 13, 14, 21, 23, 24, 25, and may be laid out in a ratio-metric arrangement with alternative series version of the design as described above so as to provide for consistent performance across temperature.

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
   a first switching element directly electrically connected to a first node along a first conductive path;
   a second switching element directly electrically connected to the first node along a second conductive path; and
   an output bump directly electrically connected to the first node along a third conductive path;
   wherein the third conductive path comprises:
   a first unbroken conductive stack extending along the first and second conductive paths and directly electrically connected between the first and second switching elements;
   a first broken conductive stack portion directly electrically connected to the first switching element and extending toward, but not reaching, the first node;
   wherein the first broken conductive stack portion is carried by the first unbroken conductive stack and is in electrical connection therewith;
   a second broken conductive stack portion directly electrically connected to the second switching element and extending toward, but not reaching, the first node, such that the first and second broken conductive stack portions are separated by a break;

wherein the second broken conductive stack portion is carried by the first unbroken conductive stack and is in electrical connection therewith;

a central conductive stack portion directly electrically connected between the first node and the output bump, the central conductive stack portion being carried partially by the first unbroken conductive stack within the break and being in electrical connection with the first unbroken conductive stack; and a second conductive stack extending between the first unbroken conductive stack at the first node and the output bump, the second conductive stack being electrically connected to the first unbroken conductive stack;

wherein the central conductive stack portion is also carried partially by the second conductive stack within the break and is electrical connected to the second conductive stack.

2. The circuit of claim 1, wherein the second conductive stack is a second unbroken conductive stack.

3. The circuit of claim 2, wherein the central conductive stack comprises:
   a plurality of resistive pillars spaced apart from one another along the third conductive path between the first node and the output bump, each resistive pillar being carried by the second unbroken conductive stack and being in electrical contact therewith; and
   an unbroken metal sheet carried by and in electrical contact with the plurality of resistive pillars, the unbroken metal sheet extending along the third conductive path between the first node and the output bump;
   wherein resistances of the resistive pillars of the plurality thereof are substantially greater than resistances of the second unbroken conductive stack.

4. The circuit of claim 3, wherein each of the plurality of resistive pillars comprises a first conductive sheet carried by and electrically connected to the second unbroken conductive stack, and a second conductive sheet carried by and electrically connected to the first conductive sheet, the second conductive sheet extending between the first conductive sheet and the unbroken metal sheet so that current flows from the second unbroken conductive stack into the first conductive sheet, through the second conductive sheet, into the unbroken metal sheet.

5. The circuit of claim 4, wherein the first conductive sheet is carried atop a first via layer sandwiched between the first conductive sheet and the second unbroken conductive stack, the first via layer electrically connecting the second unbroken conductive stack to the first conductive sheet.

6. The circuit of claim 5, wherein the second conductive sheet is carried atop a second via layer sandwiched between the second conductive sheet and the first conductive sheet, the second via layer electrically connecting the first conductive sheet to the second conductive sheet.

7. The circuit of claim 6, wherein the unbroken metal sheet is carried atop a third via layer sandwiched between the unbroken metal sheet and the second conductive sheet, the third via layer electrically connecting the second conductive sheet to the unbroken metal sheet.

8. The circuit of claim 2, wherein the central conductive stack comprises:
   a resistive pillar stack extending along the third conductive path between the first node and the output bump, the resistive pillar stack being carried by the second unbroken conductive stack and being in electrical contact therewith; and
   an unbroken metal sheet carried by and in electrical contact with the resistive pillar stack, the unbroken metal sheet extending along the third conductive path between the first node and the output bump;
   wherein resistances of the resistive pillars of the plurality thereof in a direction from the second unbroken conductive stack to the unbroken metal sheet are substantially greater than a resistance of the second unbroken conductive stack.

9. The circuit of claim 8, wherein the resistive pillar stack comprises:
   a first unbroken conductive sheet carried by and electrically connected to the second unbroken conductive stack, the first unbroken conductive sheet extending along the third conductive path between the first node and the output bump;
   a second unbroken conductive sheet carried by and electrically connected to the first unbroken conductive sheet, the second unbroken conductive sheet extending along the third conductive path between the first node and the output bump; and
   the second unbroken conductive sheet extending between the first unbroken conductive sheet and the unbroken metal sheet so that current flows from the second unbroken conductive stack into the first unbroken conductive sheet, through the second unbroken conductive sheet, into the unbroken metal sheet.

* * * * *